United States Patent
Srirattana et al.

(10) Patent No.: US 9,953,938 B2
(45) Date of Patent: Apr. 24, 2018

(54) TUNABLE ACTIVE SILICON FOR COUPLER LINEARITY IMPROVEMENT AND RECONFIGURATION

(71) Applicant: SKYWORKS SOLUTIONS, INC., Woburn, MA (US)

(72) Inventors: Nuttapong Srirattana, Billerica, MA (US); David Scott Whitefield, Andover, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/469,666

(22) Filed: Mar. 27, 2017

(65) Prior Publication Data

US 2017/0287854 A1 Oct. 5, 2017

Related U.S. Application Data

(60) Provisional application No. 62/432,020, filed on Dec. 9, 2016, provisional application No. 62/315,092, filed on Mar. 30, 2016.

(51) Int. Cl.
*H01L 23/58* (2006.01)
*H01L 23/66* (2006.01)
(Continued)

(52) U.S. Cl.
CPC .......... *H01L 23/66* (2013.01); *H01L 29/0649* (2013.01); *H03F 3/19* (2013.01); *H03F 3/21* (2013.01)

(58) Field of Classification Search
CPC ....... H01L 23/66; H01L 29/0649; H03F 3/21; H03F 3/19
(Continued)

(56) References Cited

U.S. PATENT DOCUMENTS 3,611,199 A 10/1971 Safran
3,868,594 A 2/1975 Cornwell et al.
(Continued)

FOREIGN PATENT DOCUMENTS

EP 2503701 A2 9/2012
JP S62-159502 A 7/1987
(Continued)

OTHER PUBLICATIONS

International Search Report and Written Opinion from corresponding International Application No. PCT/US2017/024240 dated Jun. 28, 2017.

*Primary Examiner* — Luan C Thai
(74) *Attorney, Agent, or Firm* — Lando & Anastasi, LLP

(57) ABSTRACT

An electromagnetic coupler assembly includes a handle wafer having an oxide layer disposed on a first surface thereof. A layer of active semiconductor is disposed on the oxide layer and includes a voltage terminal to receive a supply voltage. A layer of dielectric material is disposed on the layer of active semiconductor. A main transmission line is disposed on the layer of dielectric material. A coupled transmission line is disposed on the layer of active semiconductor and is one of inductively coupled to the main transmission line and capacitively coupled to the main transmission line. At least a portion of one of the main transmission line and the coupled transmission line is disposed directly above at least a portion of the layer of active semiconductor.

26 Claims, 27 Drawing Sheets

(51) Int. Cl.
*H01L 29/06* (2006.01)
*H03F 3/19* (2006.01)
*H03F 3/21* (2006.01)

(58) Field of Classification Search
USPC ........................................................ 257/629
See application file for complete search history.

(56) References Cited

U.S. PATENT DOCUMENTS

| | | | |
|---|---|---|---|
| 4,460,875 A | 7/1984 | Harman | |
| 4,677,399 A | 6/1987 | Le Dain et al. | |
| 4,764,740 A | 8/1988 | Meyer | |
| 5,038,112 A | 8/1991 | O'Neill | |
| 5,222,246 A | 6/1993 | Wolkstein | |
| 5,276,411 A | 1/1994 | Woodin, Jr. et al. | |
| 5,363,071 A | 11/1994 | Schwent et al. | |
| 5,487,184 A | 1/1996 | Nagode | |
| 5,625,328 A | 4/1997 | Coleman, Jr. | |
| 5,745,016 A | 4/1998 | Salminen | |
| 5,767,753 A | 6/1998 | Ruelke | |
| 5,903,820 A | 5/1999 | Hagstrom | |
| 6,020,795 A | 2/2000 | Kim | |
| 6,078,299 A | 6/2000 | Scharfe, Jr. | |
| 6,108,527 A | 8/2000 | Urban et al. | |
| 6,329,880 B2 | 12/2001 | Akiya | |
| 6,496,708 B1 | 12/2002 | Chan et al. | |
| 6,559,740 B1 | 5/2003 | Schulz et al. | |
| 6,771,141 B2 | 8/2004 | Iida et al. | |
| 6,972,640 B2 | 12/2005 | Nagamori et al. | |
| 7,042,309 B2 | 5/2006 | Podell | |
| 7,230,316 B2* | 6/2007 | Yamazaki | H01L 21/6835 257/531 |
| 7,236,069 B2 | 6/2007 | Puoskari | |
| 7,305,223 B2 | 12/2007 | Liu et al. | |
| 7,319,370 B2 | 1/2008 | Napijalo | |
| 7,336,142 B2 | 2/2008 | Vogel | |
| 7,493,093 B2 | 2/2009 | Boerman et al. | |
| 7,538,635 B2 | 5/2009 | Fukuda et al. | |
| 7,546,089 B2 | 6/2009 | Bellantoni | |
| 7,966,140 B1 | 6/2011 | Gholson, III et al. | |
| 7,973,358 B2* | 7/2011 | Hanke | H01P 5/18 257/335 |
| 8,115,234 B2* | 2/2012 | Nakajima | H01L 27/0207 257/194 |
| 8,175,554 B2 | 5/2012 | Camuffo et al. | |
| 8,248,302 B2 | 8/2012 | Tsai et al. | |
| 8,289,102 B2 | 10/2012 | Yamamoto et al. | |
| 8,315,576 B2 | 11/2012 | Jones | |
| 8,334,580 B2* | 12/2012 | Sakurai | H01L 23/66 257/508 |
| 8,417,196 B2 | 4/2013 | Kitching et al. | |
| 8,526,890 B1 | 9/2013 | Chien et al. | |
| 8,606,198 B1 | 12/2013 | Wright | |
| 8,633,761 B2 | 1/2014 | Lee | |
| 8,761,026 B1 | 6/2014 | Berry et al. | |
| 8,810,331 B2 | 8/2014 | Gu et al. | |
| 9,014,647 B2 | 4/2015 | Kitching et al. | |
| 9,214,967 B2 | 12/2015 | Reisner et al. | |
| 9,356,330 B1 | 5/2016 | Donoghue et al. | |
| 9,425,835 B2 | 8/2016 | Seckin et al. | |
| 9,496,902 B2 | 11/2016 | Srirattana et al. | |
| 9,553,617 B2 | 1/2017 | Srirattana et al. | |
| 9,634,371 B2 | 4/2017 | Swarup et al. | |
| 9,755,670 B2 | 9/2017 | Chen et al. | |
| 2002/0097100 A1 | 7/2002 | Woods et al. | |
| 2002/0113666 A1 | 8/2002 | Yamazaki et al. | |
| 2002/0139975 A1 | 10/2002 | Lewis et al. | |
| 2003/0214365 A1 | 11/2003 | Adar et al. | |
| 2004/0127178 A1 | 7/2004 | Kuffner | |
| 2004/0201526 A1 | 10/2004 | Knowles et al. | |
| 2005/0017821 A1 | 1/2005 | Sawicki | |
| 2005/0040912 A1 | 2/2005 | Pelz | |
| 2005/0146394 A1 | 7/2005 | Podell | |
| 2005/0170794 A1 | 8/2005 | Koukkari et al. | |
| 2005/0239421 A1 | 10/2005 | Kim et al. | |
| 2006/0232359 A1 | 10/2006 | Fukuda et al. | |
| 2007/0082642 A1 | 4/2007 | Hattori | |
| 2007/0159268 A1 | 7/2007 | Podell | |
| 2008/0036554 A1 | 2/2008 | Krausse et al. | |
| 2008/0055187 A1 | 3/2008 | Tamura et al. | |
| 2008/0056638 A1 | 3/2008 | Glebov et al. | |
| 2008/0070519 A1 | 3/2008 | Okabe | |
| 2008/0112466 A1 | 5/2008 | Sasaki | |
| 2009/0134953 A1 | 5/2009 | Hunt et al. | |
| 2009/0195335 A1 | 8/2009 | Wahl et al. | |
| 2009/0278624 A1 | 11/2009 | Tsai et al. | |
| 2009/0280755 A1 | 11/2009 | Camuffo et al. | |
| 2009/0322313 A1 | 12/2009 | Zhang et al. | |
| 2011/0057746 A1 | 3/2011 | Yamamoto et al. | |
| 2011/0063044 A1 | 3/2011 | Jones | |
| 2011/0148548 A1 | 6/2011 | Uhm et al. | |
| 2011/0199166 A1 | 8/2011 | Carrillo-Ramirez | |
| 2011/0254637 A1 | 10/2011 | Manssen et al. | |
| 2011/0279192 A1 | 11/2011 | Nash et al. | |
| 2011/0298559 A1 | 12/2011 | Kitching et al. | |
| 2012/0019332 A1 | 1/2012 | Hino et al. | |
| 2012/0019335 A1 | 1/2012 | Hoang et al. | |
| 2012/0062333 A1 | 3/2012 | Ezzeddine et al. | |
| 2012/0071123 A1 | 3/2012 | Jones et al. | |
| 2012/0243579 A1 | 9/2012 | Premakanthan et al. | |
| 2013/0005284 A1 | 1/2013 | Dalipi | |
| 2013/0113575 A1 | 5/2013 | Easter | |
| 2013/0194054 A1 | 8/2013 | Presti | |
| 2013/0207741 A1 | 8/2013 | Presti | |
| 2013/0241668 A1 | 9/2013 | Tokuda et al. | |
| 2013/0293316 A1 | 11/2013 | Kitching et al. | |
| 2013/0307635 A1 | 11/2013 | Kase et al. | |
| 2014/0152253 A1 | 6/2014 | Ozaki et al. | |
| 2014/0266499 A1 | 9/2014 | Noe | |
| 2014/0368293 A1 | 12/2014 | Mukaiyama | |
| 2015/0002239 A1 | 1/2015 | Tanaka | |
| 2015/0042412 A1 | 2/2015 | Imbornone et al. | |
| 2015/0043669 A1 | 2/2015 | Ella et al. | |
| 2015/0048910 A1 | 2/2015 | LaFountain et al. | |
| 2015/0091668 A1 | 4/2015 | Solomko et al. | |
| 2015/0200437 A1 | 7/2015 | Solomko et al. | |
| 2015/0249485 A1 | 9/2015 | Ouyang et al. | |
| 2015/0270821 A1 | 9/2015 | Natarajan et al. | |
| 2015/0326202 A1 | 11/2015 | Nicholls et al. | |
| 2015/0349742 A1 | 12/2015 | Chen et al. | |
| 2015/0372366 A1 | 12/2015 | Frye | |
| 2016/0025928 A1 | 1/2016 | Onawa | |
| 2016/0028147 A1 | 1/2016 | Srirattana et al. | |
| 2016/0028420 A1 | 1/2016 | Srirattana et al. | |
| 2016/0043458 A1 | 2/2016 | Sun et al. | |
| 2016/0065167 A1 | 3/2016 | Granger-Jones et al. | |
| 2016/0079649 A1 | 3/2016 | Ilkov et al. | |
| 2016/0079650 A1 | 3/2016 | Solomko et al. | |
| 2016/0172737 A1 | 6/2016 | Srirattana et al. | |
| 2016/0172738 A1 | 6/2016 | Srirattana et al. | |
| 2016/0172739 A1 | 6/2016 | Srirattana et al. | |
| 2016/0172740 A1 | 6/2016 | Srirattana et al. | |
| 2016/0268994 A1 | 9/2016 | Granger-Jones et al. | |
| 2016/0344430 A1 | 11/2016 | Srirattana et al. | |
| 2016/0344431 A1 | 11/2016 | Srirattana et al. | |
| 2017/0033428 A1 | 2/2017 | Ootsuka et al. | |
| 2017/0063425 A1 | 3/2017 | Khlat et al. | |
| 2017/0085245 A1 | 3/2017 | Srirattana et al. | |

FOREIGN PATENT DOCUMENTS

| | | |
|---|---|---|
| JP | 2000-077915 A | 3/2000 |
| JP | 2001127664 A | 5/2001 |
| JP | 2013126067 A | 6/2013 |
| KR | 20040037465 A | 5/2004 |
| KR | 20110118289 A | 10/2011 |
| KR | 20120007790 A | 1/2012 |
| WO | 2005018451 A1 | 3/2005 |
| WO | 2015020927 A2 | 2/2015 |
| WO | 2015134979 A1 | 9/2015 |

* cited by examiner

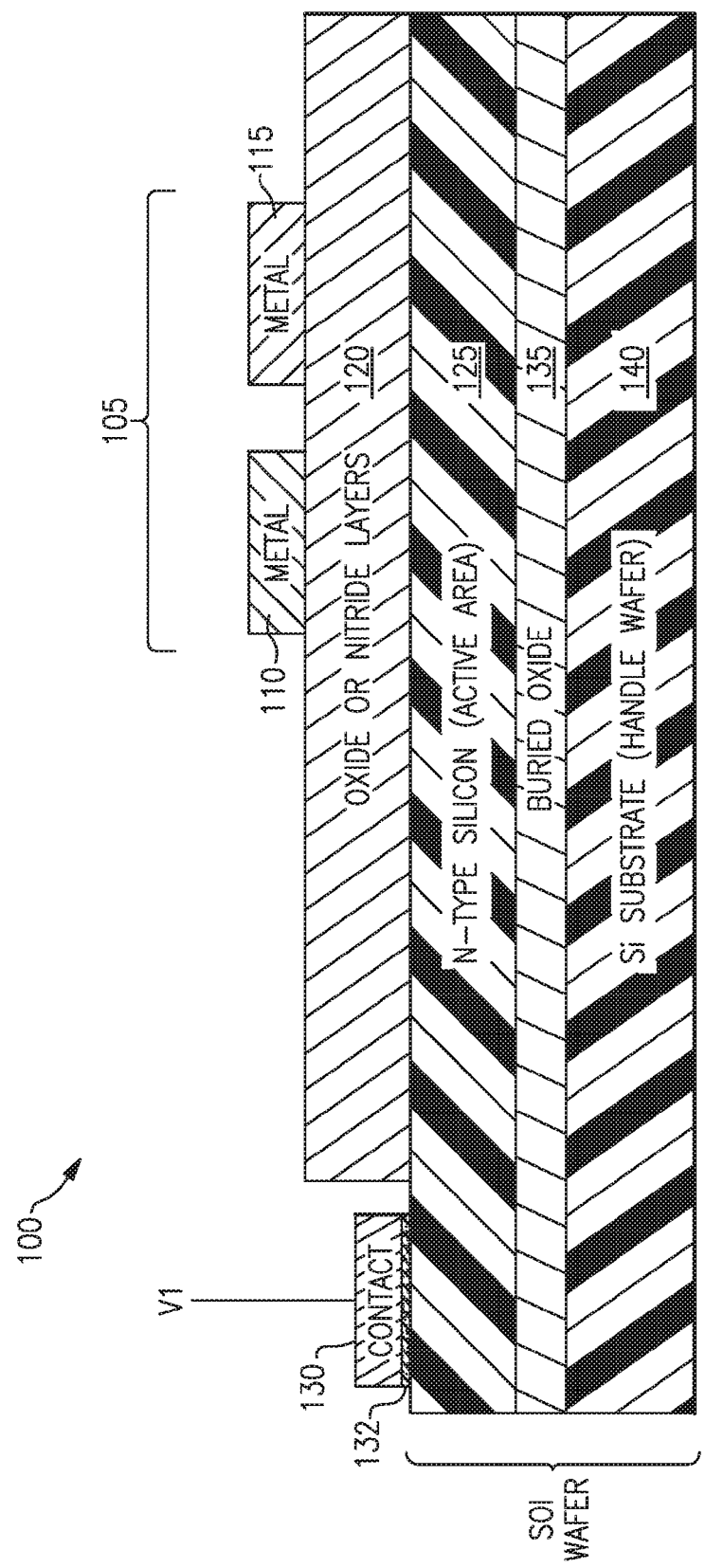

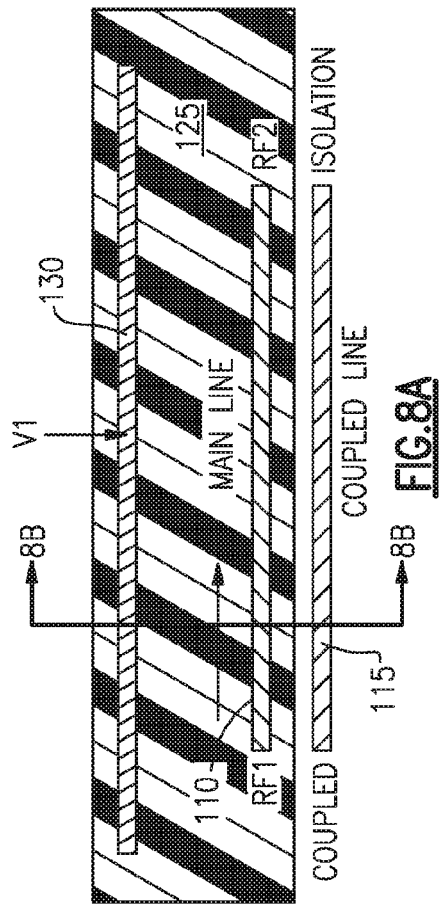
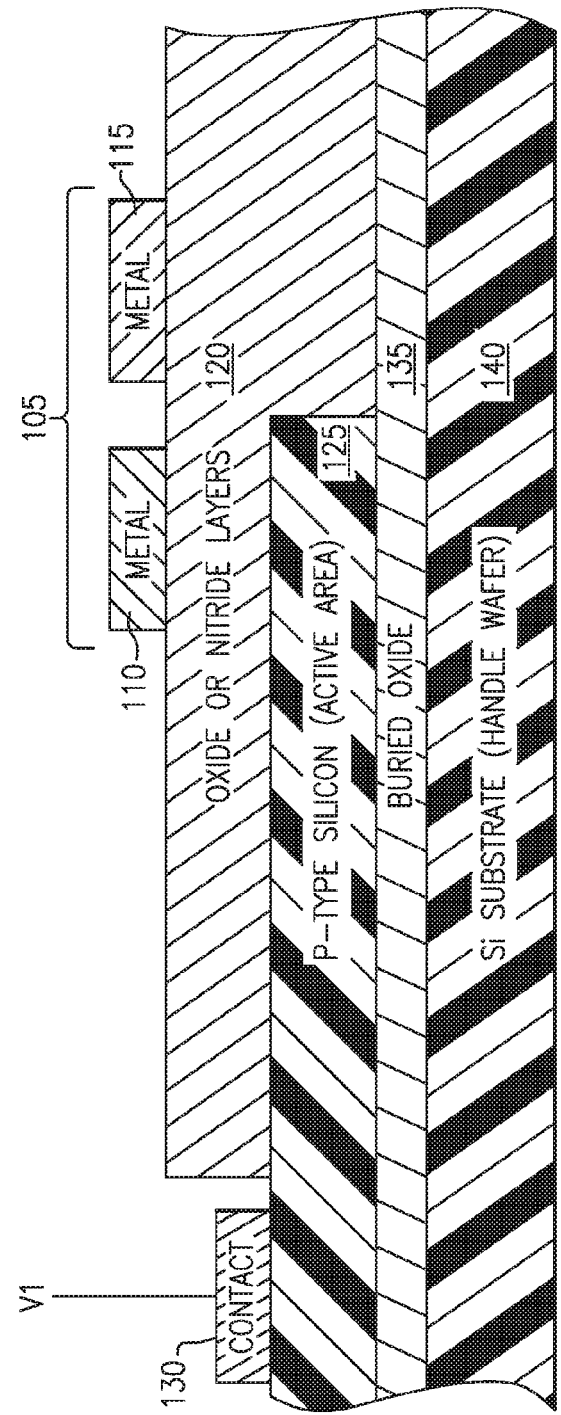
FIG. 8A
FIG. 8B

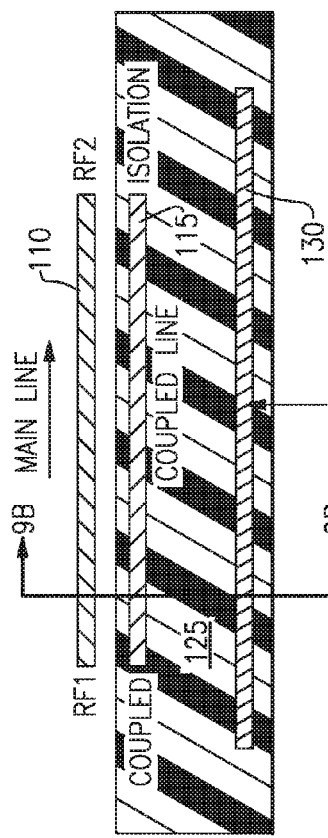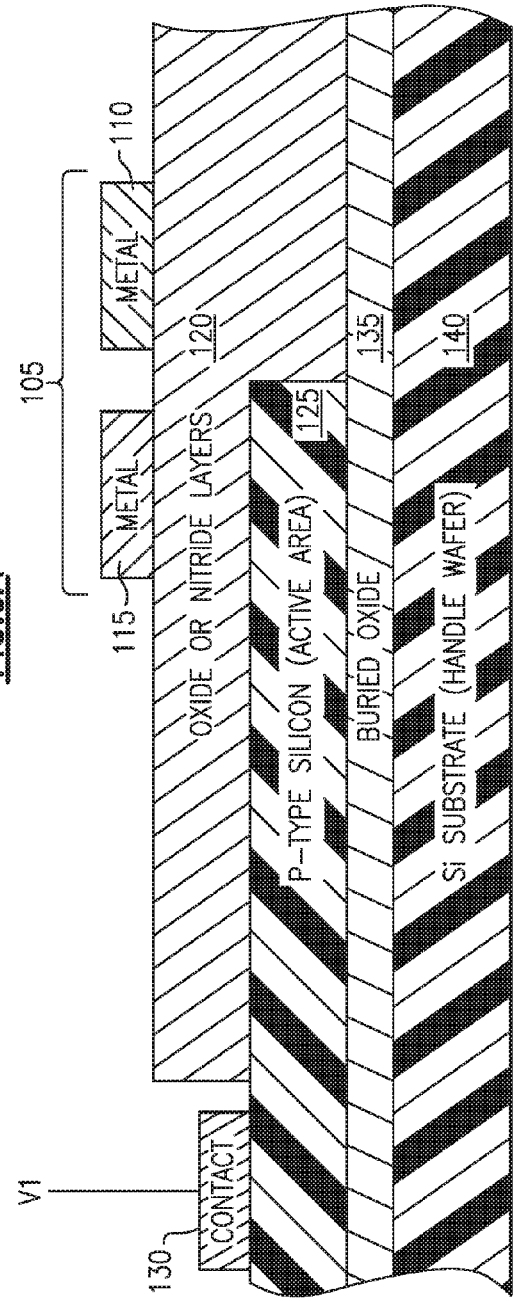

US 9,953,938 B2

TUNABLE ACTIVE SILICON FOR COUPLER LINEARITY IMPROVEMENT AND RECONFIGURATION

CROSS-REFERENCE TO RELATED APPLICATION

This application claims priority under 35 U.S.C. § 119(e) to U.S. Provisional Application Ser. No. 62/315,092 titled "TUNABLE ACTIVE SILICON FOR COUPLER LINEARITY IMPROVEMENT AND RECONFIGURATION," filed Mar. 30, 2016, and to U.S. Provisional Application Ser. No. 62/432,020 titled "TUNABLE ACTIVE SILICON FOR COUPLER LINEARITY IMPROVEMENT AND RECONFIGURATION," filed Dec. 9, 2016, each of which is incorporated herein by reference in its entirety for all purposes.

BACKGROUND

Electromagnetic couplers, such as radio frequency (RF) couplers are used in a variety of applications to extract a signal for measurement, monitoring, or other uses. For example, an RF coupler can be included in a signal path between an RF source and a load (such as an antenna) to provide an indication of forward RF power of the RF signal traveling from the RF source to the load and/or an indication of reverse RF power reflected back from the load. An RF coupler typically has a power input port, a power output port, a coupled port, and an isolated port. When a termination impedance is presented to the isolated port, an indication of forward RF power traveling from the power input port to the power output port is provided at the coupled port. When a termination impedance is presented to the coupled port, an indication of reverse RF power traveling from the power output port to the power input port is provided at the isolated port. The termination impedance is typically implemented by a 50 Ohm shunt resistor in a variety of conventional RF couplers.

FIG. 1 is a block diagram illustrating an example of a typical arrangement of an RF "front-end" sub-system 10 as may be used in a communications device, such as a mobile phone, for example, to transmit RF signals. A power amplifier 11 provides gain to an RF signal input to the sub-system, producing an amplified RF signal. A filter 12 is used to filter out unwanted frequencies from the amplified RF signal. An RF coupler 13 is used to extract a portion of the power from the RF signal traveling between the filter 12 and an antenna 14. The antenna 14 transmits the RF signal.

SUMMARY

Aspects and embodiments relate to electronic systems and, in particular, to electromagnetic (EM) couplers.

In accordance with one aspect, there is provided an electromagnetic coupler assembly. The electromagnetic coupler assembly comprises a handle wafer including an oxide layer disposed on a first surface thereof, a layer of active semiconductor disposed on the oxide layer and including a voltage terminal to receive a supply voltage, a layer of dielectric material disposed on the layer of active semiconductor, a main transmission line disposed on the layer of dielectric material, and a coupled transmission line disposed on the layer of dielectric material. The coupled transmission line is one of inductively coupled to the main transmission line and capacitively coupled to the main transmission line. At least a portion of one of the main transmission line and the coupled transmission line is disposed directly above at least a portion of the layer of active semiconductor.

In some embodiments, the electromagnetic coupler assembly further comprises a second layer of dielectric material disposed above one of the main transmission line and the coupled transmission line and below the other of the main transmission line and the coupled transmission line.

In some embodiments, the layer of active semiconductor comprises one of N-type silicon and P-type silicon.

In some embodiments, the voltage terminal is positioned to a single side of the main transmission line and of the coupled transmission line.

In some embodiments, the voltage terminal surrounds an area beneath portions of the main transmission line and of the coupled transmission line.

In some embodiments, the layer of active semiconductor is disposed beneath a portion of the main transmission line but not beneath the coupled transmission line.

In some embodiments, the layer of active semiconductor is disposed beneath a portion of the coupled transmission line but not beneath the main transmission line.

In some embodiments, the layer of active semiconductor includes a first portion disposed beneath a portion of the coupled transmission line and a second portion electrically isolated from the first portion and disposed beneath a portion of the main transmission line. In some embodiments, the electromagnetic coupler assembly includes a first voltage terminal in electrical communication with the first portion of the layer of active semiconductor and a second voltage terminal in electrical communication with the second portion of the layer of active semiconductor.

In some embodiments, the layer of active semiconductor includes a plurality of portions electrically isolated from one another, each of the plurality of portions disposed beneath different respective portions of the main transmission line and the coupled transmission line.

In some embodiments, each of the plurality of portions of the layer of active semiconductor includes a respective voltage terminal.

In some embodiments, the voltage terminal includes a first portion disposed beneath the main transmission line and the coupled transmission line at a position laterally positioned from a first side of the main transmission line and of the coupled transmission line in a direction normal to a direction of intended signal flow through one of the main transmission line and the coupled transmission line and a second portion disposed beneath the main transmission line and the coupled transmission line at a position laterally positioned from a second side of the main transmission line and of the coupled transmission line in a second direction normal to the direction of intended signal flow through the one of the main transmission line and the coupled transmission line.

In some embodiments, the voltage terminal includes a first portion disposed beneath the main transmission line and the coupled transmission line at a position laterally disposed from a first side of the main transmission line and of the coupled transmission line in a direction parallel to a direction of intended signal flow through one of the main transmission line and the coupled transmission line and a second portion disposed beneath the main transmission line and the coupled transmission line at a position laterally disposed from a second side of the main transmission line and of the coupled transmission line in a second direction parallel to the direction of intended signal flow through the one of the main transmission line and the coupled transmission line.

In some embodiments, the layer of active semiconductor includes a doping concentration that varies along a direction normal to a direction of intended signal flow through one of the main transmission line and the coupled transmission line.

In some embodiments, the layer of active semiconductor includes a doping concentration that varies along a direction parallel to a direction of intended signal flow through one of the main transmission line and the coupled transmission line.

In some embodiments, application of the supply voltage to the layer of active semiconductor reduces a magnitude of substrate effects in the electromagnetic coupler assembly as compared to a magnitude of substrate effects in the electromagnetic coupler assembly in an absence of the application of the supply voltage to the layer of active semiconductor.

In accordance with another aspect, there is provided a packaged module. The packaged module comprises an electromagnetic coupler assembly. The electromagnetic coupler assembly includes a silicon on insulator (SOI) wafer including a handle wafer having an oxide layer disposed on a first surface thereof, a layer of active semiconductor disposed on the oxide layer, a voltage terminal disposed on the layer of active semiconductor to receive a supply voltage, a layer of dielectric material disposed on the layer of active semiconductor, a main transmission line disposed on the layer of dielectric material, and a coupled transmission line disposed on the layer of dielectric material and configured to provide a coupled signal on the coupled line responsive to receipt of an input signal received on the main transmission line, at least a portion of one of the main transmission line and the coupled transmission line being disposed above at least a portion of the layer of active semiconductor. In accordance with another aspect, there is provided an electronic device including the packaged module. In accordance with another aspect, there is provided wireless communications device including the packaged module.

In accordance with another aspect, there is provided an electromagnetic coupler assembly. The electromagnetic coupler assembly comprises a handle wafer including an oxide layer disposed on a first surface thereof, an active semiconductor layer disposed on at least a portion of the oxide layer, the active semiconductor layer including a voltage terminal to receive a supply voltage, a dielectric layer disposed on the active semiconductor layer, and a coupler disposed on the dielectric layer, the active semiconductor layer extending at least partially below the coupler to electrically isolate the handle wafer from the coupler based on application of the supply voltage.

In accordance with another aspect, there is provided method of fabricating an electromagnetic coupler assembly. The method comprises depositing a layer of dielectric material on an upper surface of active semiconductor of a silicon on insulator (SOI) wafer including a layer of the active semiconductor, a buried oxide layer disposed beneath the layer of the active semiconductor, and a handle wafer disposed beneath the buried oxide layer, forming an electrical contact with the layer of the active semiconductor, forming a main transmission line above the layer of dielectric material, and forming a coupled transmission line above the layer of dielectric material, the coupled transmission line configured to provide a coupled signal on the coupled transmission line responsive to receipt of an input signal received on the main transmission line, at least a portion of one of the main transmission line and the coupled transmission line being formed above at least a portion of the layer of active semiconductor.

In some embodiments, both the main transmission line and the coupled transmission line are formed in contact with an upper surface of the layer of dielectric material.

In some embodiments, the method further comprises forming one of the main transmission line and the coupled transmission line in contact with an upper surface of the layer of dielectric material, forming a second layer of dielectric material over the layer of dielectric material, and forming the other of the main transmission line and the coupled transmission line on an upper surface of the second layer of dielectric material.

In some embodiments, one of the main transmission line and the coupled transmission line is formed above at least a portion of the layer of active semiconductor and the other of the main transmission line and the coupled transmission line is not formed above at least a portion of the layer of active semiconductor.

In some embodiments, both the main transmission line and the coupled transmission line are formed above at least a portion of the layer of active semiconductor.

In some embodiments, the method further comprises removing at least a lower portion of the handle wafer.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 3A is a simplified pictorial representation of an embodiment of an RF coupler structure;

FIG. 8A is a simplified plan view of another embodiment of an RF coupler structure;

FIG. 8B is a simplified cross-sectional view of the RF coupler structure of FIG. 8A;

FIG. 9A is a simplified plan view of another embodiment of an RF coupler structure;

FIG. 9B is a simplified cross-sectional view of the RF coupler structure of FIG. 9A;

DETAILED DESCRIPTION

Figure 1:
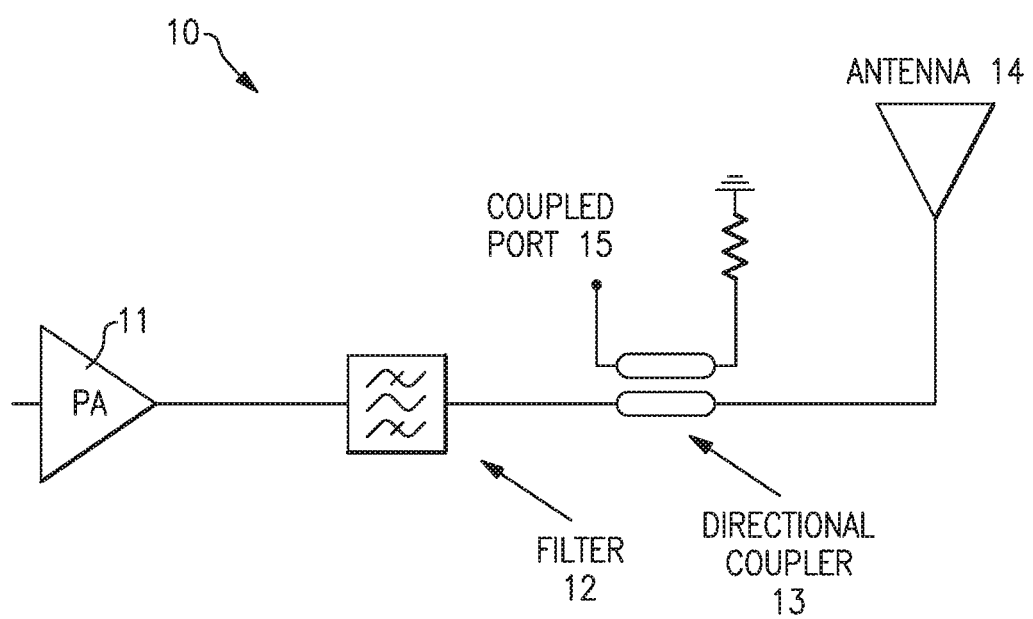
FIG. 1 is a block diagram of one example of a conventional RF front-end system including an individual filter cascaded with an RF coupler.

Aspects and embodiments disclosed herein include systems and methods for reducing substrate induced nonlinearity in electromagnetic (EM) couplers and to apparatus including such systems.

An EM coupler (referred to herein as simply a "coupler") can be formed on, for example, a silicon (Si) handle wafer substrate or a silicon on insulator (SOI) handle wafer substrate, using two transmission lines (a main line and a coupled line) to create capacitive and inductive coupling effects. Substrate effects in couplers can include a capacitive effect from capacitance between coupler transmission lines and the handle wafer substrate and an inductive effect due to induced inductive current flowing in the handle wafer substrate, sometimes referred to as the "mirror effect." The induced inductive current flowing in silicon handle wafer substrates may create nonlinearity in the form of harmonics, for example, but not limited to, second order (2fo) harmonics (the second harmonic of a signal passing through the coupler transmission line). The buried oxide in SOI substrates is an insulator that helps isolate the silicon substrate handle wafer from the coupler lines, reducing substrate effects but not completely eliminating the substrate effects.

Couplers typically include a main line carrying, for example, an RF signal, and a coupled line that is used to obtain an indication of properties of the signal travelling through the main line. The main and coupled lines in couplers may be arranged in various fashions, for example, as illustrated in FIGS. 2A-2D to provide different relative degrees of capacitive and inductive coupling. It should be appreciated that the main line and coupled line, or portions thereof, in any of the embodiments disclosed herein may be displaced from one another in a plane parallel to the surface of a die in which they are included, and/or may be displaced from one another in a plane perpendicular to the surface of a die in which they are included and may form either planar or three dimensional couplers. Various portions of the coiled main and coupled lines illustrated in FIG. 2B and other embodiments disclosed herein may be on different layers of a layer stack or between different dielectric layers of a dielectric layer stack of a die in which they are included as shown, for example, in FIG. 2C. The coils of the main and coupled lines illustrated in FIG. 2B and other embodiments disclosed herein may be coiled about an axis perpendicular to the surface of a die in which they are included, may be coiled about an axis parallel to the surface of a die in which they are included, may be coiled about an axis angled with respect to the surface of a die in which they are included, or combinations thereof. Further, although described herein as a main line and a coupled line, the metallic structures forming the main and coupled lines need not be linear, but may have non-linear shapes.

A structure that enables the reduction in substrate effects in a coupler is illustrated in FIG. 3A generally at 100. A coupler 105 including a main line 110 and coupled line 115 is disposed on and in contact with a first dielectric layer 120. The main line 110 and the coupled line 115 may comprise or consist of a metal or metal alloy including, for example, aluminum, copper, or other metals or non-metallic conductors known in the art. Dielectric layer 120 may comprise or consist of, for example, silicon dioxide, silicon nitride, or other dielectrics known in the art. Dielectric layer 120 is disposed on and in contact with an active layer 125. Active layer 125 is illustrated in FIG. 3A as comprising N-type silicon, but in other embodiments may be any form of semiconductor or combination of semiconductors known in the art. A contact 130 (also referred to herein as a "voltage terminal") is provided in electrical communication and in physical contact with the active layer 125. Contact 130 allows a voltage V1 to be applied to the active layer 125 from an external voltage source (not shown). Contact 130 may comprise, for example, aluminum, copper, or other materials suitable for electrical contacts as known in the art, and may include a diffusion barrier and/or adhesion layer 132 of titanium, titanium nitride, tantalum, tantalum nitride, indium oxide, tungsten nitride, or other diffusion barrier and/or adhesion layer materials known in the art at the interface between the remainder of the contact 130 and the active layer 125. A buried dielectric layer 135, for example, a buried silicon dioxide layer is disposed below and in contact with the active layer 125. A handle or support wafer 140 is disposed below and in contact with the buried dielectric layer 135. In some embodiments, the handle wafer 140 is lightly doped or comprises intrinsic semiconductor and is thus highly resistive with a resistivity of, for example, about 1 kΩ-cm or more. The combination of active layer 125, buried dielectric layer 135, and handle wafer 140 may be collectively referred to as a SOI substrate or SOI wafer. In some embodiments, the handle wafer 140 may be thinned or ground down during processing, for example, by backside grinding.

The active layer 125, in combination with the buried dielectric layer 135, may be utilized to electrically shield the coupler 105 from the handle wafer 140 to reduce or eliminate substrate effects exhibited in the coupler 105 due to the presence of the handle wafer 140. In use, when a negative voltage V1 is applied to the active layer 125, the active layer 125 becomes more conductive and acts similar to a ground plane to electrically shield the coupler 105 from the handle wafer 140 or to increase a degree of electrical shielding of the coupler 105 from the handle wafer 140. Without being bound to a particular theory, it is believed that applying the negative voltage to the N-type silicon of the active layer 125 increases the concentration of free electrons in the active layer 125, thus increasing the conductivity of the active layer 125. Application of the negative voltage V1 to the active layer 125 increases performance of the coupler 105, as compared to the performance of the coupler 105 in the absence of the voltage V1 being applied to the active layer 125, by improving linearity of the coupler, for example, by decreasing second harmonic generation due to induced current flowing in the handle wafer 140.

Figure 3B:
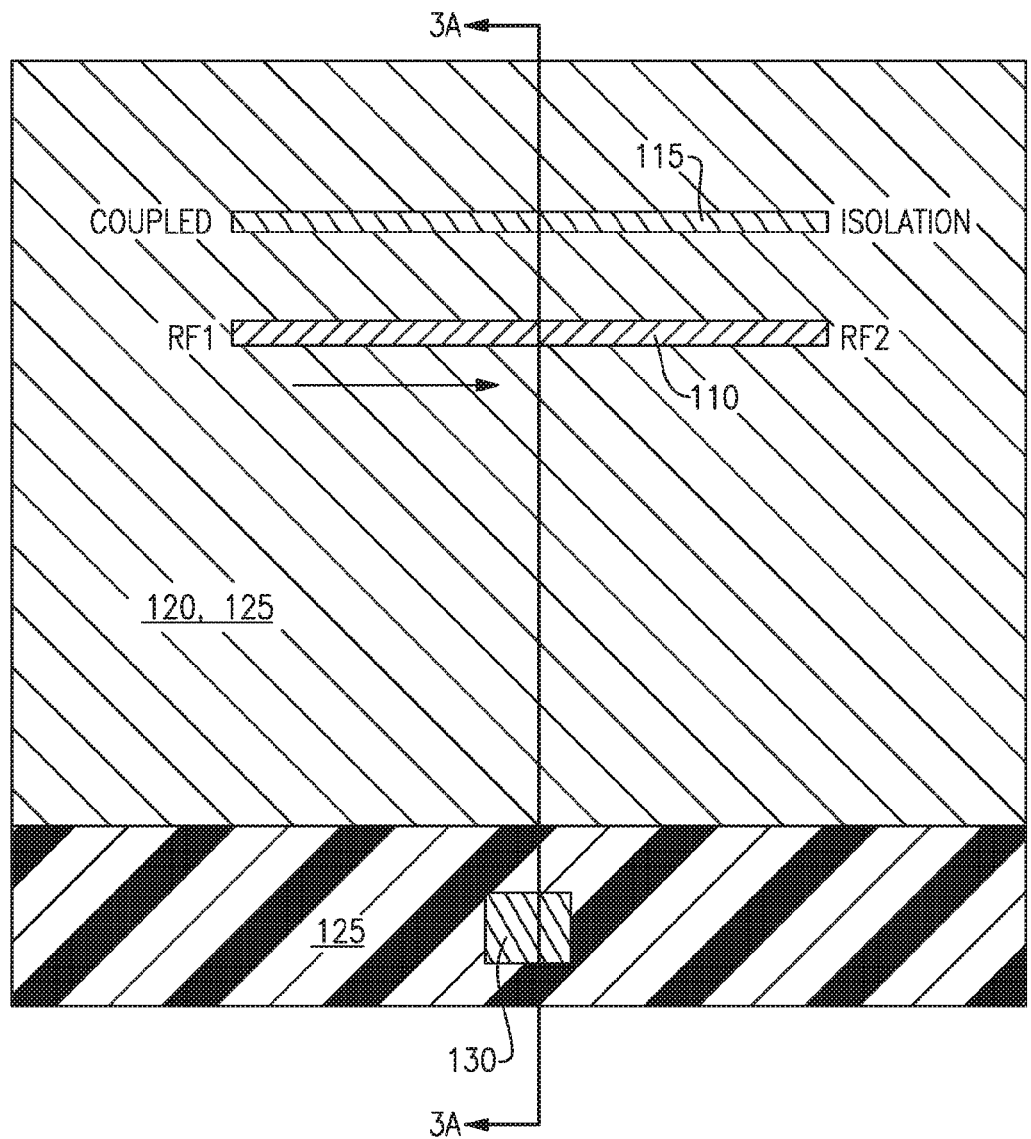
FIG. 3B is a simplified plan view of the embodiment of FIG. 3A.

A plan view of an embodiment of a coupler structure having the stack of layers illustrated in FIG. 3A is illustrated in FIG. 3B. The first dielectric layer 120 is disposed on top of active layer 125 in the region labelled 120, 125 in this figure. The view illustrated in FIG. 3A is a view along the line 3A illustrated in FIG. 3B.

Figure 4A:
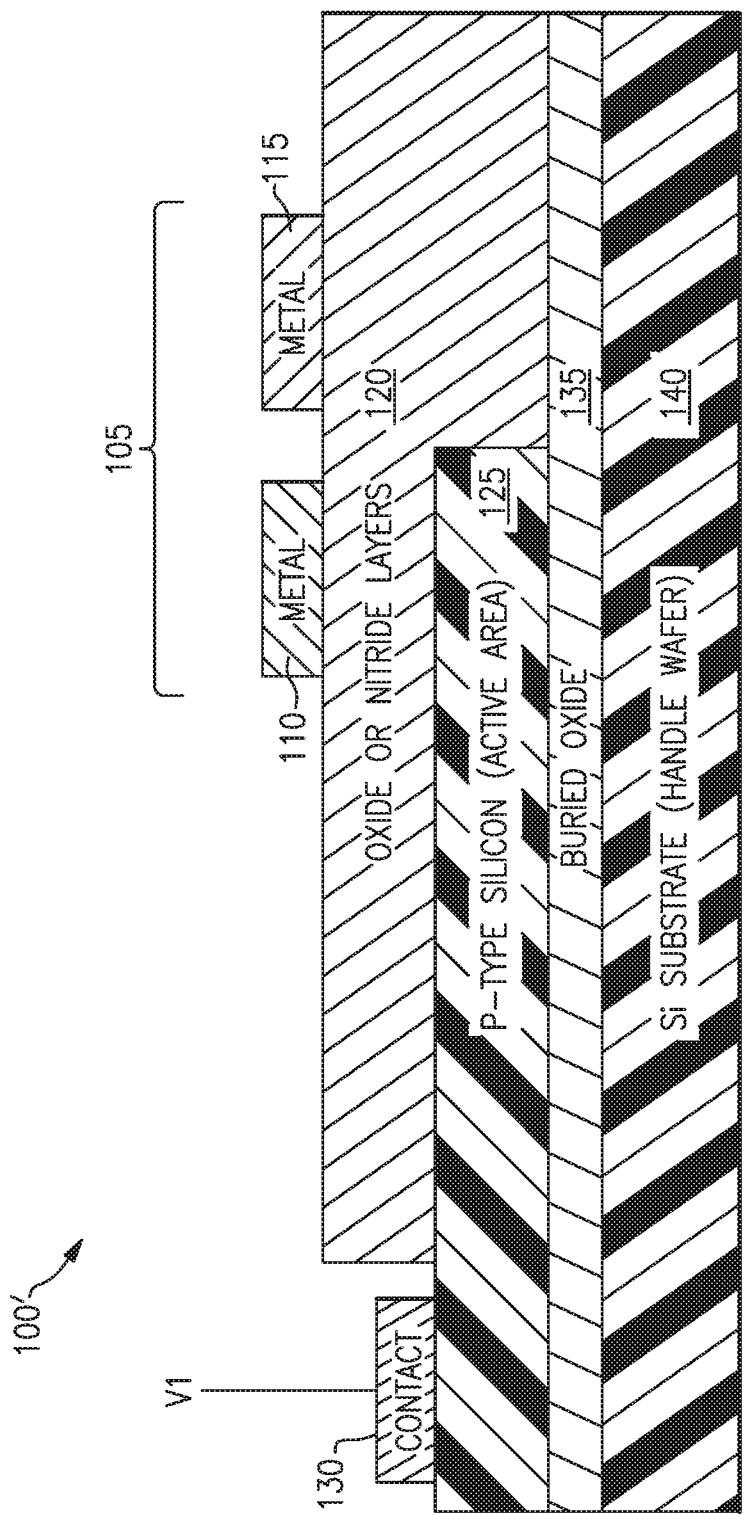
FIG. 4A is a simplified pictorial representation of another embodiment of an RF coupler structure.

FIG. 4A illustrates an example structure, indicated generally at 100', that enables the reduction in substrate effects in a coupler utilizing P-type silicon as the active layer 125. When the applied voltage V1 is positive, the conductivity of the active layer increases and the performance of the coupler 105 is increased as compared to the performance of the coupler 105 in the absence of the voltage V1 being applied to the active layer 125. As also illustrated in FIG. 4A, in some embodiments, the active layer 125 may be disposed beneath the main line 110, but not necessarily the coupled line 115.

Figure 4B:
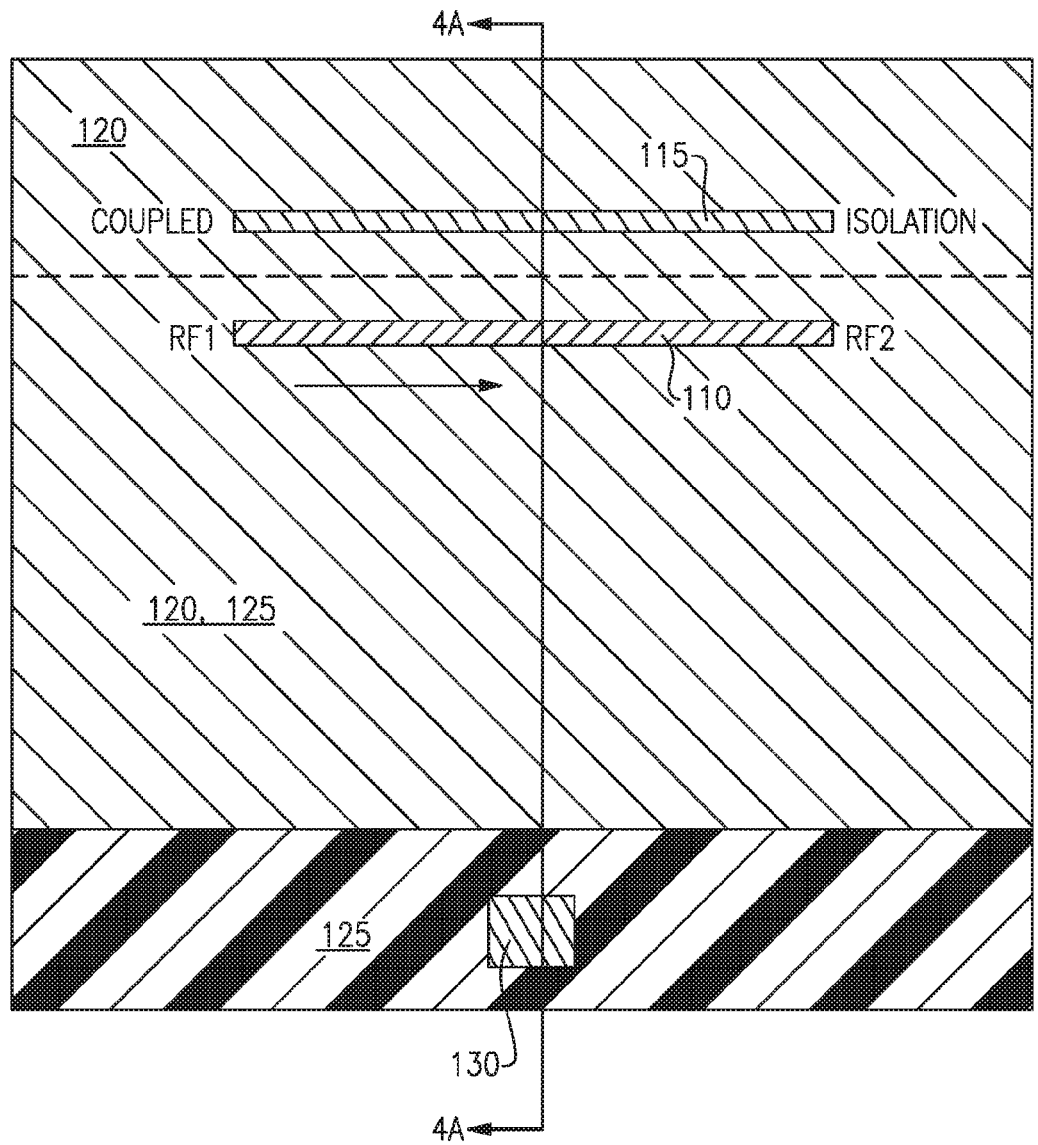
FIG. 4B is a simplified plan view of the embodiment of FIG. 4A.

A plan view of an embodiment of a coupler structure having the stack of layers illustrated in FIG. 4A is illustrated in FIG. 4B. The first dielectric layer 120 is disposed on top of active layer 125 in the region labelled 120, 125 in this figure. The view illustrated in FIG. 4A is a view along the line 4A illustrated in FIG. 4B.

The use of an active layer 125 that may be electrically biased to enable shielding the coupler 105 from the handle wafer 140 instead of a ground plane may provide for various advantages. In some embodiments, the active layer 125 provides for a lower insertion loss in the coupler 105 than would a ground plane. The ground plane effect is permanent and its presence increases ground parasitics of the coupler, hence higher insertion loss. The use of active layer 125 and its adjustable biasing allows for optional use of active layer 125 as a ground plane. When biasing is not applied (e.g. 0V/short or floated) there will not be the added parasitics from the coupler to the highly conductive active layer 125 (which is behaving like a ground plane) therefore lower insertion loss. Also, the ability to bias the active layer 125 to different voltages allows one to tailor the performance of the coupler 105, for example, by changing the inductance and capacitance characteristics of the coupler 105, resulting in changes to the coupling factor of the coupler 105, and/or directivity of the coupler 105 at different frequencies. In some embodiments, increasing the magnitude or absolute value of the applied voltage V1 (to a more negative voltage when the active layer 125 is N-type or to a more positive voltage when the active layer 125 is P-type) may decrease the coupling factor of the coupler 105.

Figure 2A:
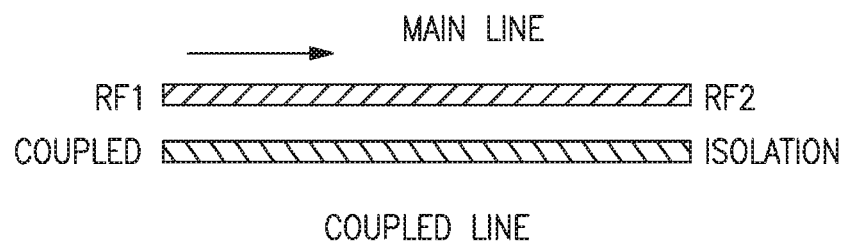
FIG. 2A is a simplified plan view of one arrangement of main and coupled lines in an RF coupler.
Figure 2B:
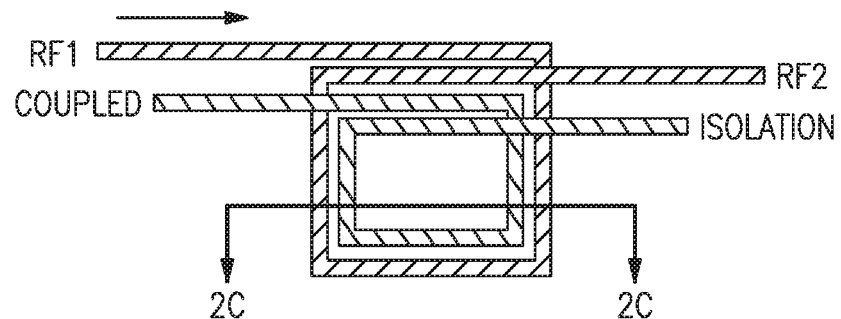
FIG. 2B is a simplified plan view of another arrangement of main and coupled lines in an RF coupler.
Figure 5A:
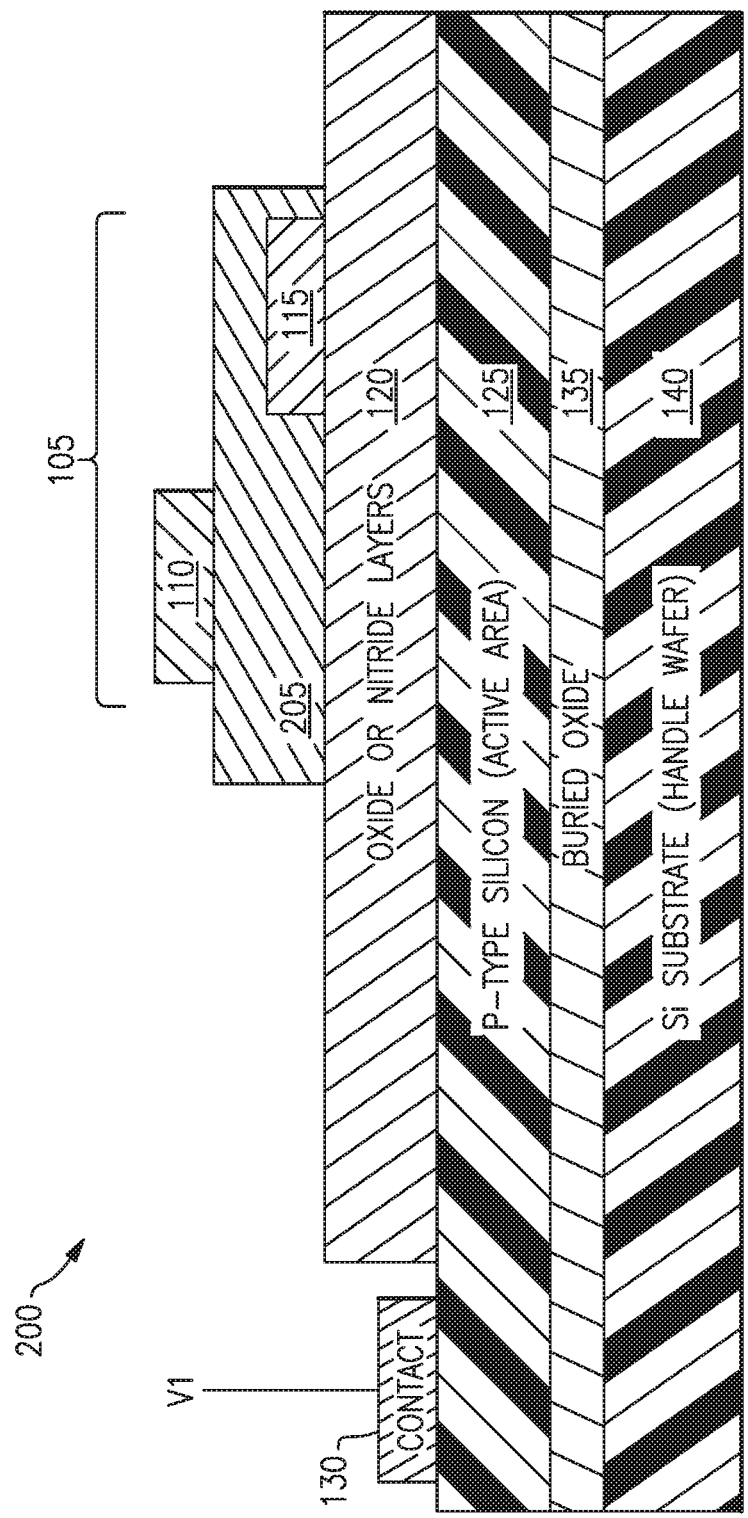
FIG. 5A is a simplified pictorial representation of another embodiment of an RF coupler structure.

In another embodiment, an additional dielectric layer may be provided below the main line 110 or the coupled line 115 of the coupler 105. For example, as illustrated in FIG. 5A, generally at 200, a dielectric layer 205 provided below the main line 110 and over the coupled line 115 (or vice-versa) may provide for one of the main line 110 or the coupled line 115 to pass over or under the other of the main line 110 or the coupled line 115 to result in a configuration as illustrated in FIG. 2B, for example. The dielectric layer 205 may comprise or consist of the same material or materials as first dielectric layer 120 or of a different material or materials.

Figure 5B:
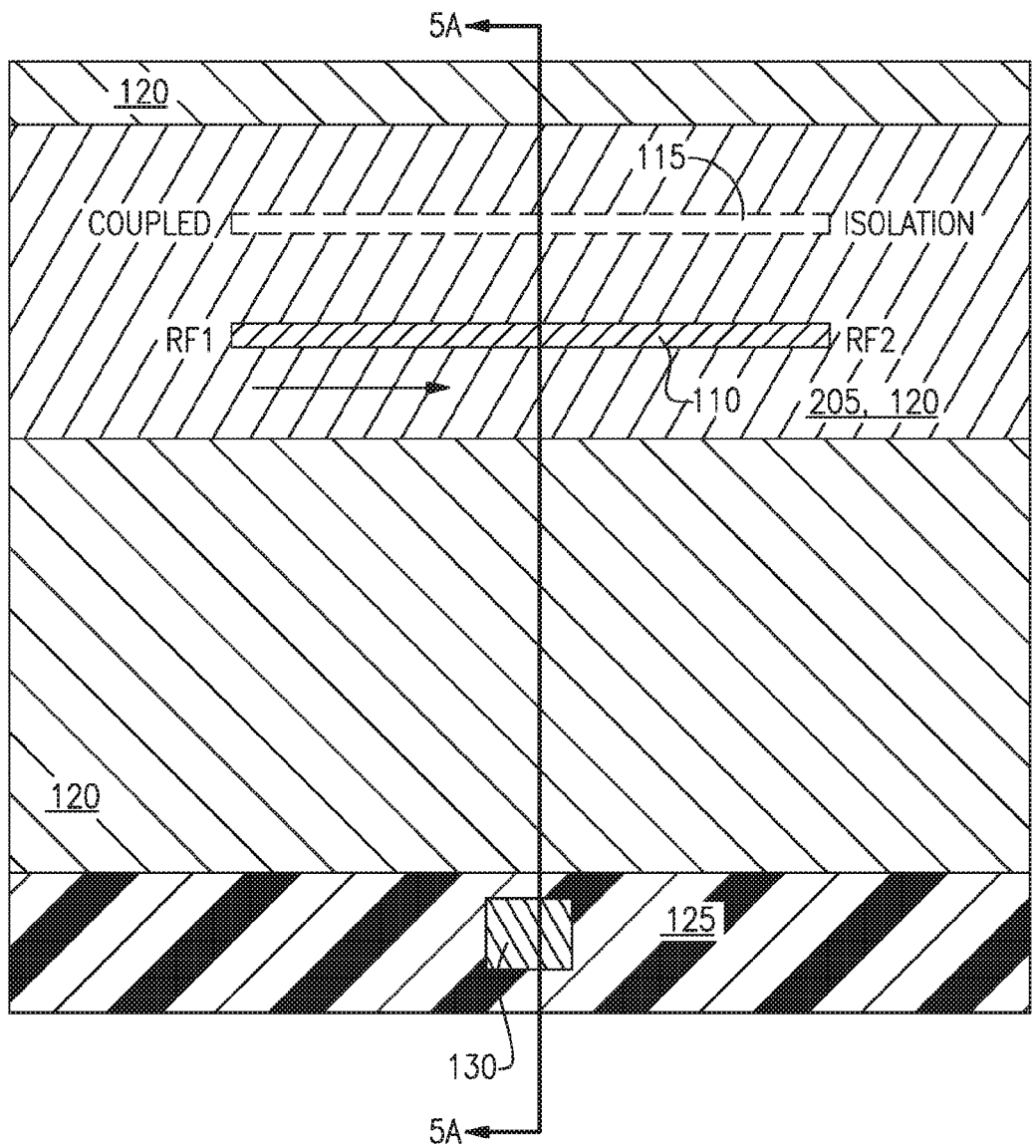
FIG. 5B is a simplified plan view of the embodiment of FIG. 5A.

A plan view of an embodiment of a coupler structure having the stack of layers illustrated in FIG. 5A is illustrated in FIG. 5B. The first dielectric layer 120 is omitted from this figure to illustrate the position of the active layer 125 and dielectric layer 205 relative to the main line 110 and coupled line 115. In FIG. 5B, the coupled line 115 is illustrated in dashed lines to indicate that it is below dielectric layer 205. The view illustrated in FIG. 5A is a view along the line 5A illustrated in FIG. 5B.

Figure 5C:
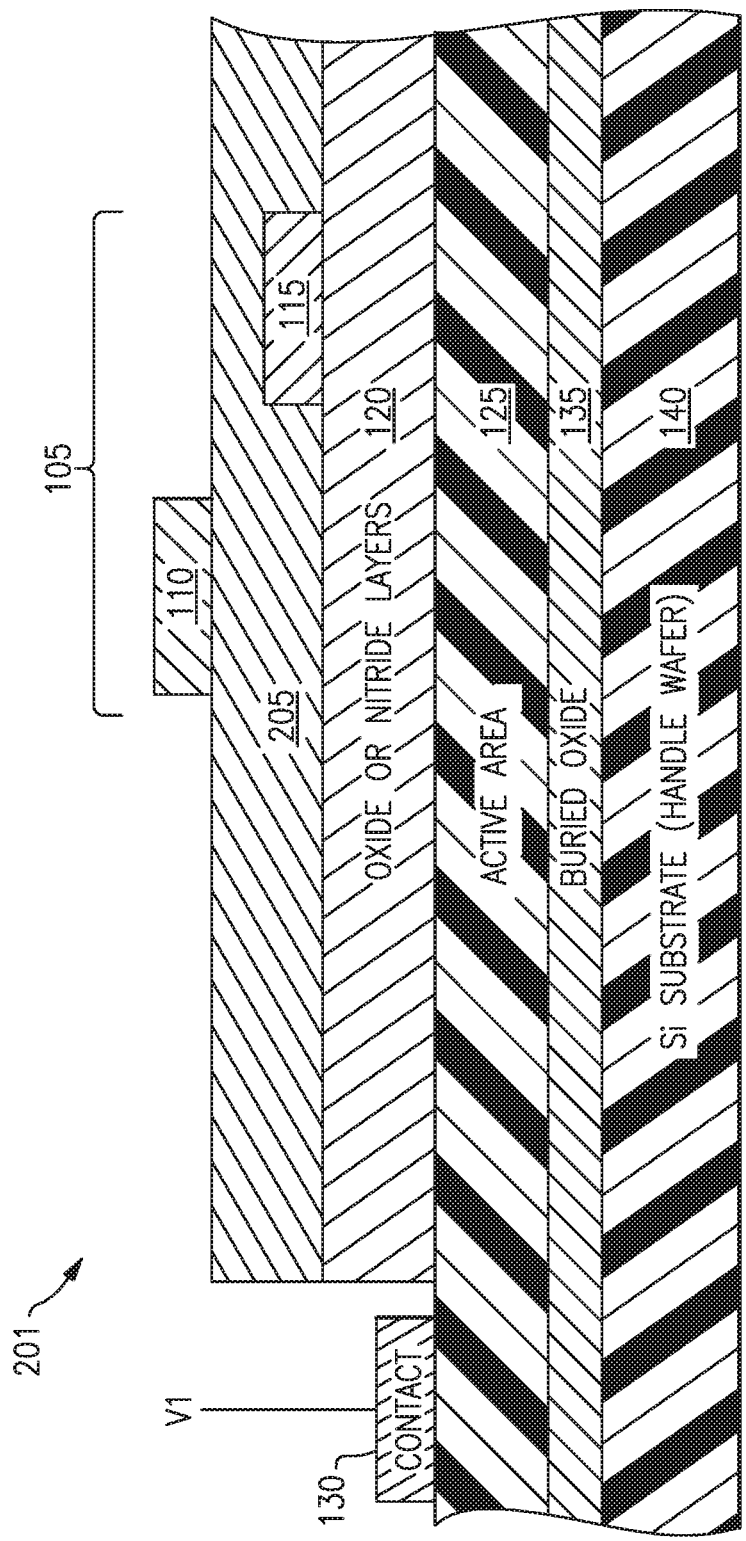
FIG. 5C is a simplified pictorial representation of another embodiment of an RF coupler structure.
Figure 5D:
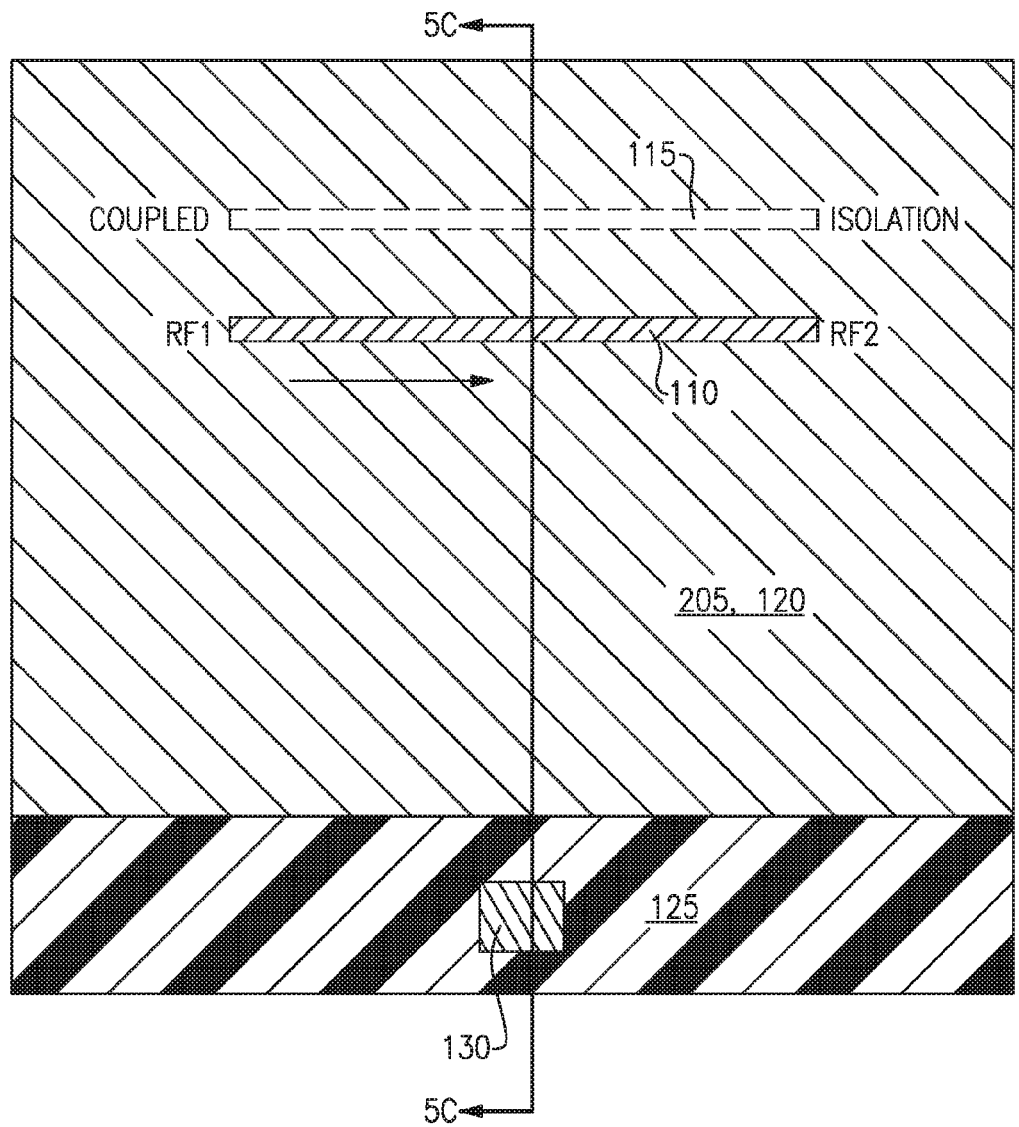
FIG. 5D is a simplified plan view of the embodiment of FIG. 5C.

In a further embodiment, illustrated in FIG. 5C, generally at 201, the dielectric layer 205 is substantially or fully coextensive with first dielectric layer 120. A plan view of an embodiment of a coupler structure having the stack of layers illustrated in FIG. 5C is illustrated in FIG. 5D. The first dielectric layer 120 is not illustrated separately in FIG. 5D because it is coextensive with and disposed beneath dielectric layer 205 in the region labelled 205, 120. In FIG. 5D, the coupled line 115 is illustrated in dashed lines to indicate that it is below dielectric layer 205. The view illustrated in FIG. 5C is a view along the line 5C illustrated in FIG. 5D.

Figure 5E:
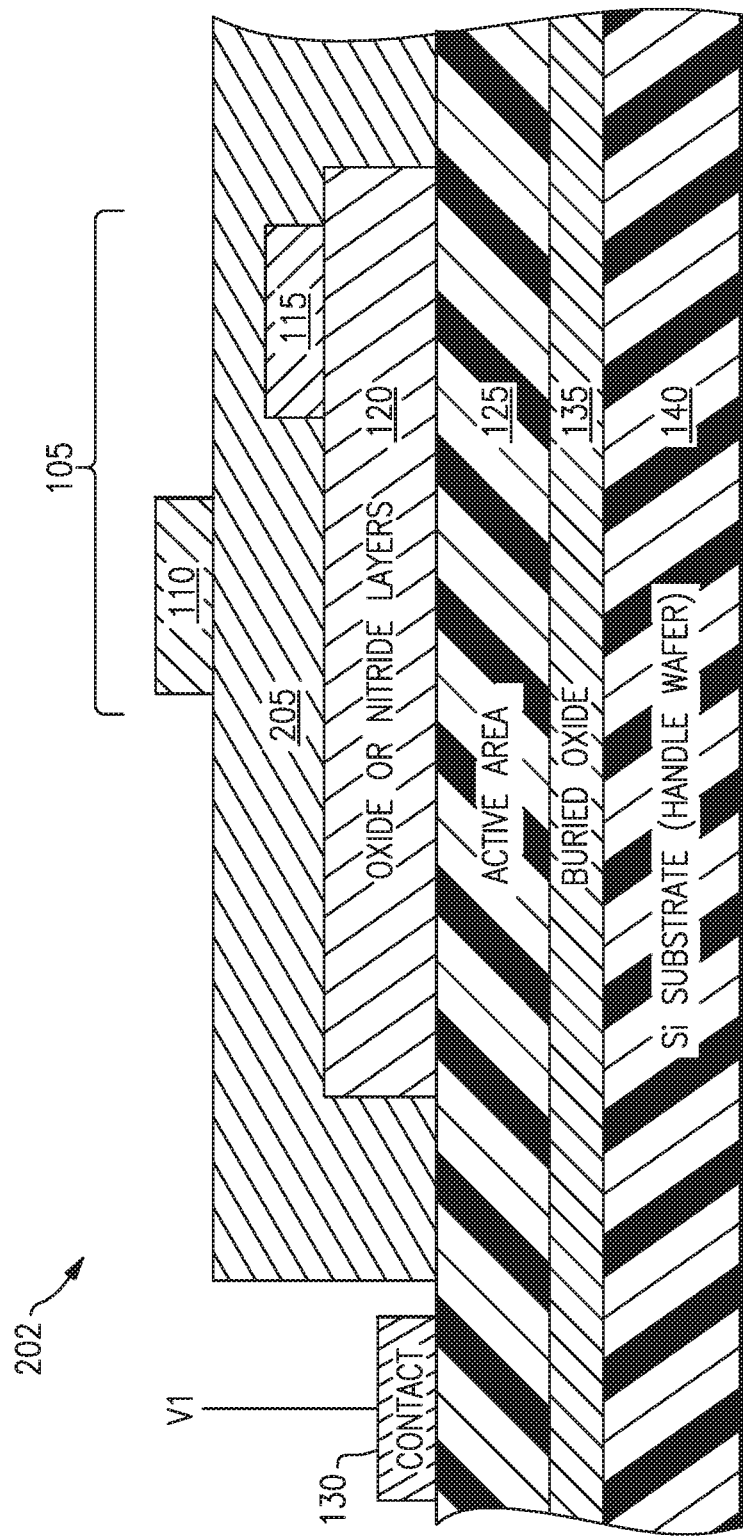
FIG. 5E is a simplified pictorial representation of another embodiment of an RF coupler structure.
Figure 5F:
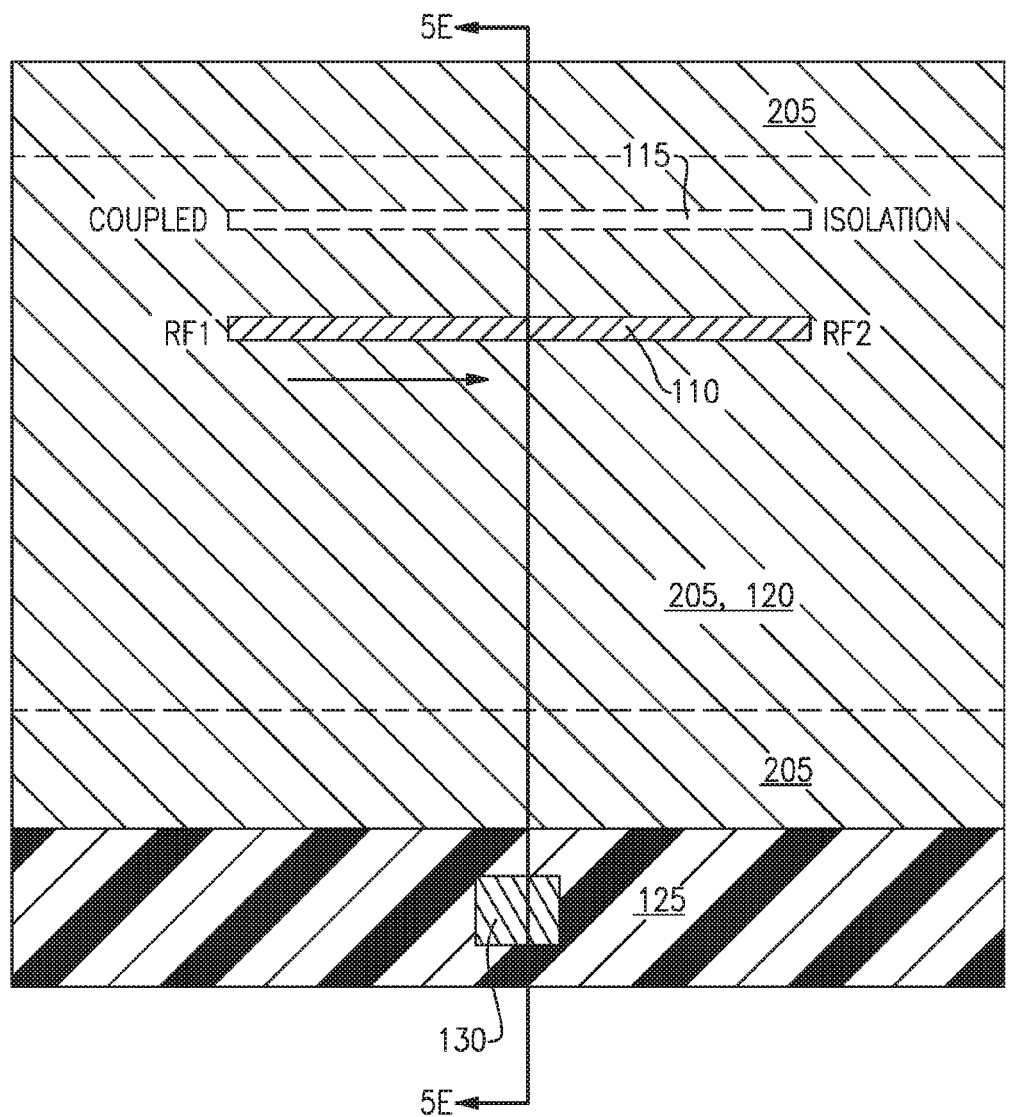
FIG. 5F is a simplified plan view of the embodiment of FIG. 5E.

Alternatively, as illustrated in FIG. 5E, generally at 202, the dielectric layer 205 has one or more borders extending beyond one or more borders of first dielectric layer 120. A plan view of an embodiment of a coupler structure having the stack of layers illustrated in FIG. 5E is illustrated in FIG. 5F. In FIG. 5F, the coupled line 115 is illustrated in dashed lines to indicate that it is below dielectric layer 205. The view illustrated in FIG. 5E is a view along the line 5E illustrated in FIG. 5F.

Figure 5G:
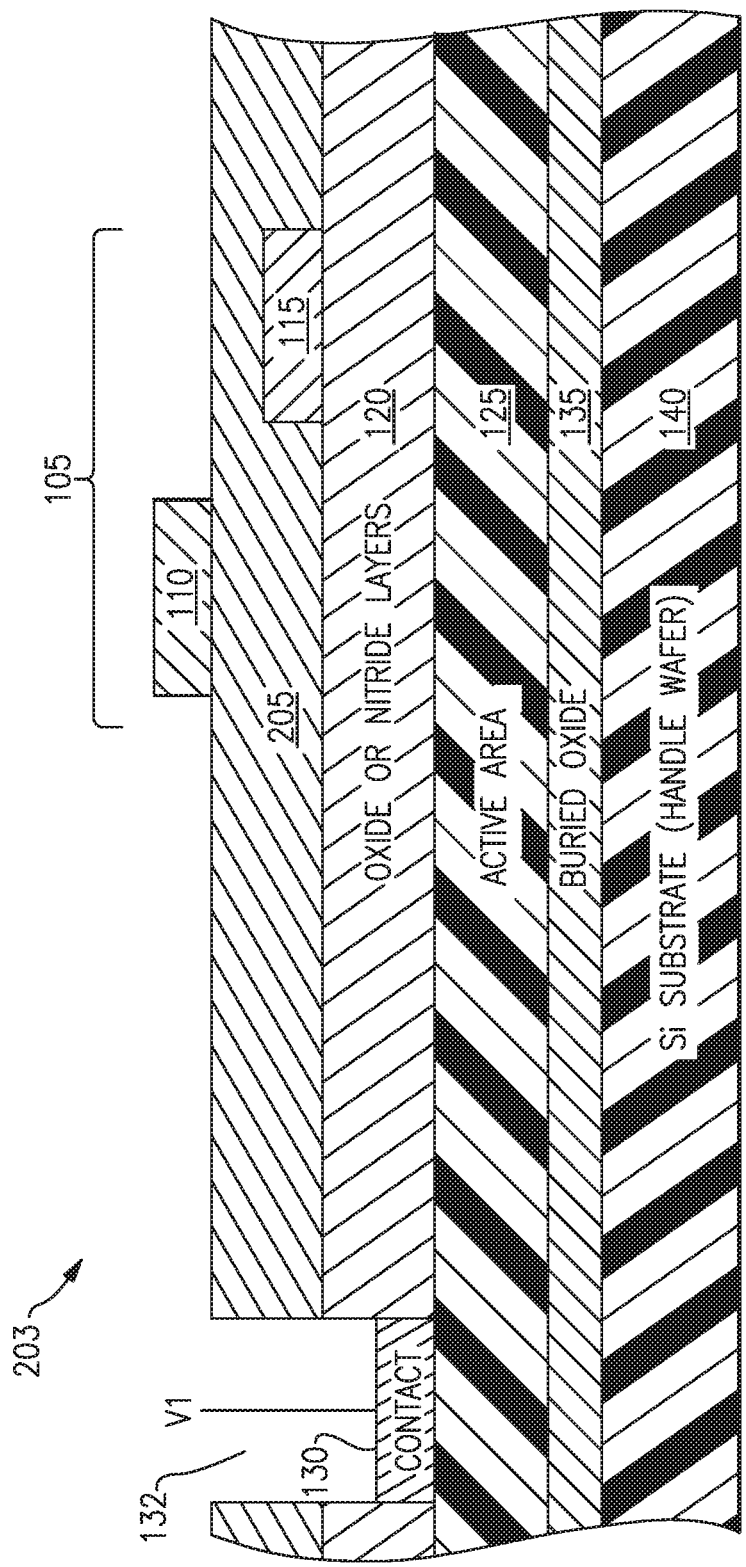
FIG. 5G is a simplified pictorial representation of another embodiment of an RF coupler structure.
Figure 5H:
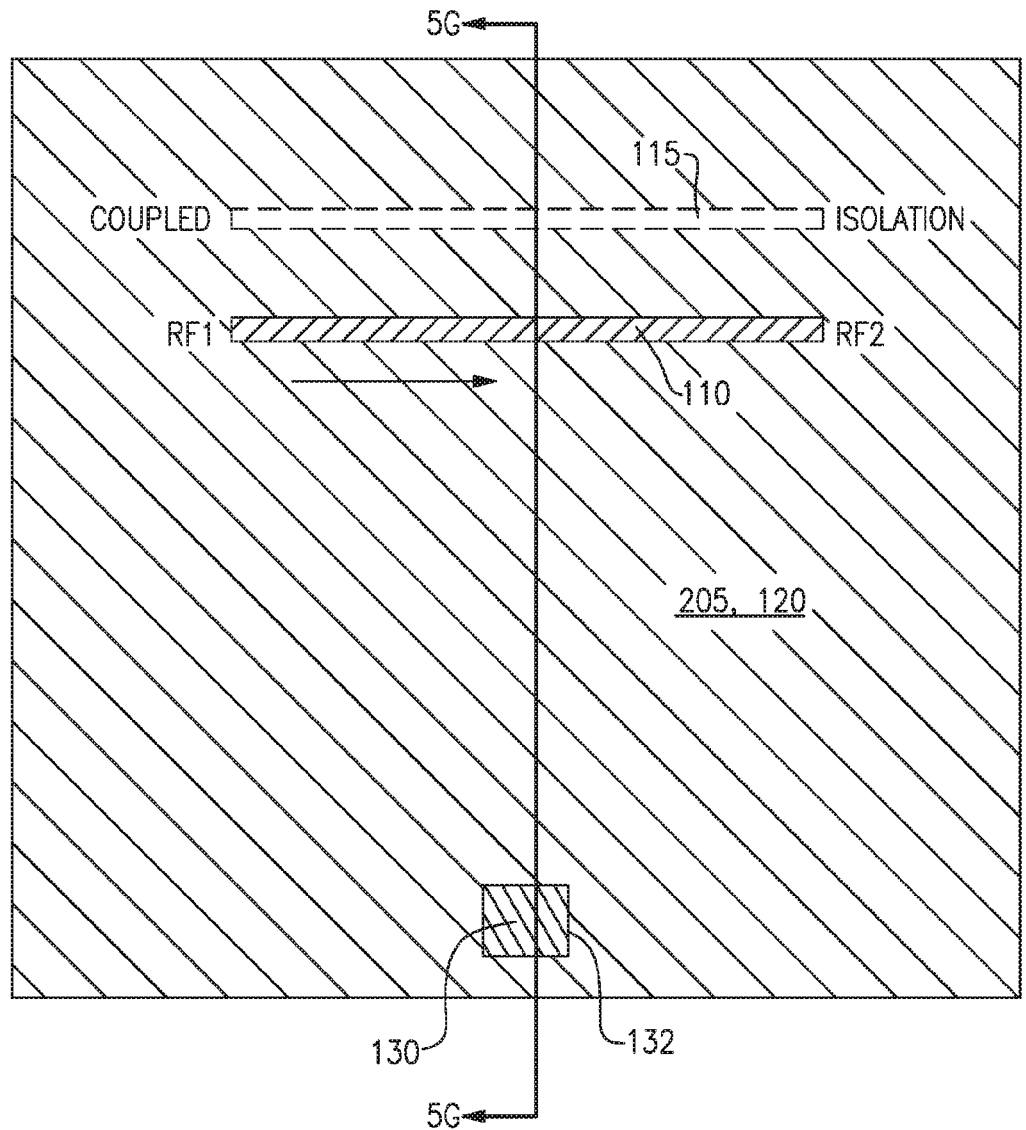
FIG. 5H is a simplified plan view of the embodiment of FIG. 5G.

In another embodiment, illustrated in FIG. 5G, generally at 203, one or both of the dielectric layer 205 and the first dielectric layer 120 may be deposited over the contact 130. A via 132 may be etched through one or both of the dielectric layer 205 and the first dielectric layer 120 to provide for electrical contact to be made to the contact 130. Contact 130 may be deposited before or after etching of the via 132. A plan view of an embodiment of a coupler structure having the stack of layers illustrated in FIG. 5G is illustrated in FIG. 5H. In FIG. 5H, the coupled line 115 is illustrated in dashed lines to indicate that it is below dielectric layer 205. The view illustrated in FIG. 5G is a view along the line 5G illustrated in FIG. 5H.

Figure 5I:
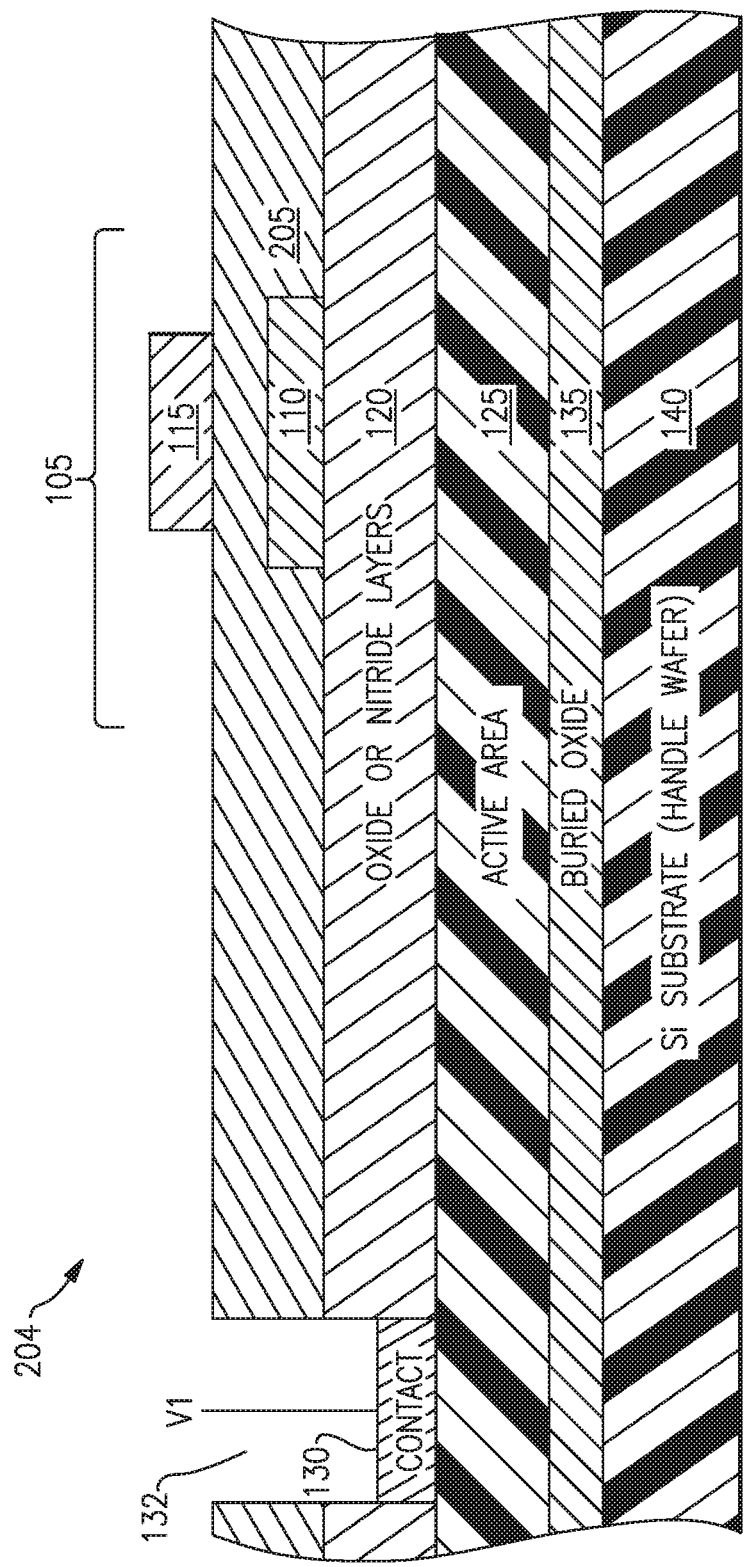
FIG. 5I is a simplified pictorial representation of another embodiment of an RF coupler structure.
Figure 5J:
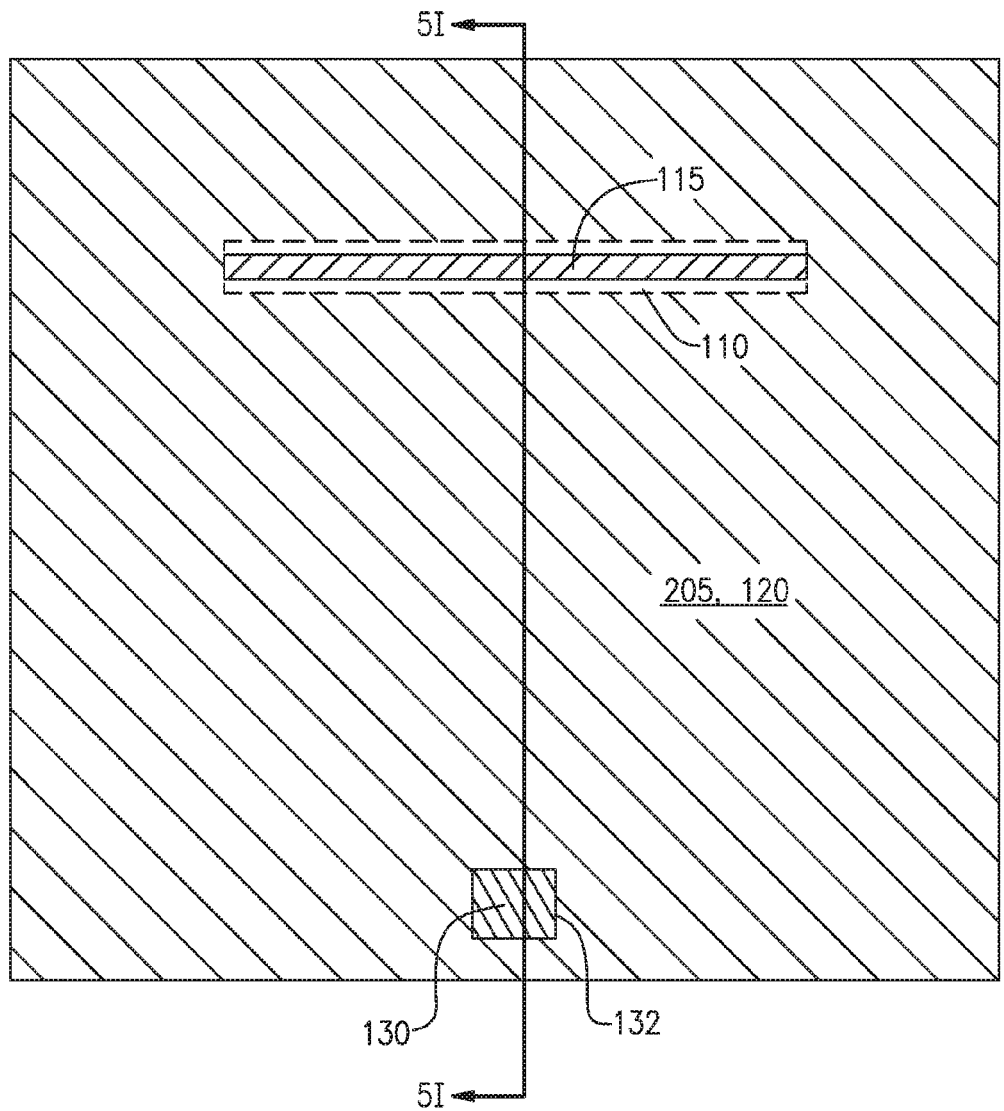
FIG. 5J is a simplified plan view of the embodiment of FIG. 5I.

It should be appreciated that in any of the embodiments of the coupler structures disclosed herein, the main line 110 and coupled line 115 need not have similar dimensions, for example, widths or thicknesses. In various embodiments the main line 110 may be thinner, thicker, wider, or narrower than the coupled line 115. FIG. 5I illustrates an embodiment, indicated generally at 204, in which the main line 110 is both wider and thinner than the coupled line 115. FIG. 5I also illustrates that the coupled line 115 may be disposed at least partially or wholly above the main line 110. As shown, the coupled line 115 may be disposed directly above the main line 110. In other embodiments, the main line 110 may be at least partially or wholly (centered or not) disposed above the coupled line 115. A plan view of an embodiment of a coupler structure having the stack of layers illustrated in FIG. 5I is illustrated in FIG. 5J. In FIG. 5J, the coupled line 115 is illustrated in dashed lines to indicate that it is below dielectric layer 205. The view illustrated in FIG. 5I is a view along the line 5I illustrated in FIG. 5J.

Figure 2C:
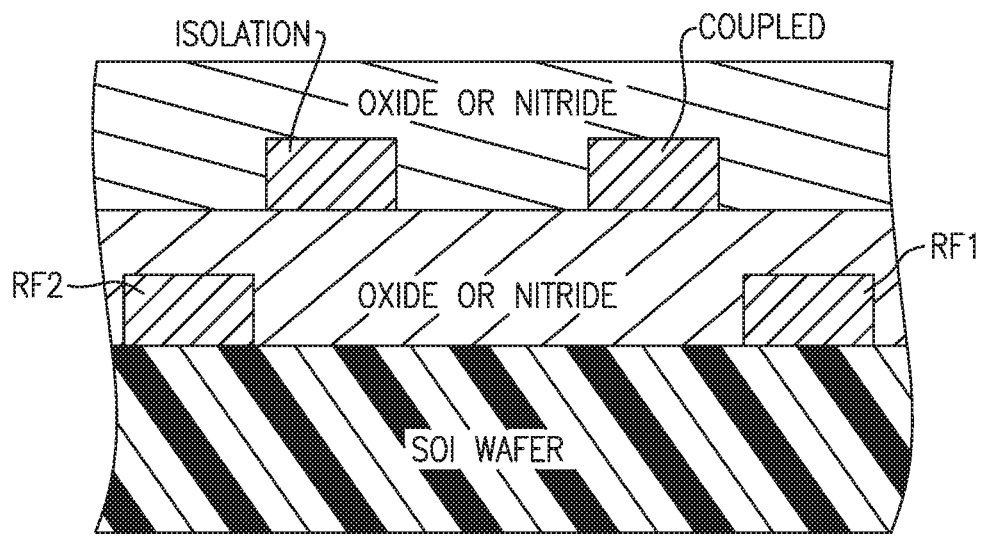
FIG. 2C is a simplified cross-sectional view of the main and coupled lines in the RF coupler of FIG. 2B.
Figure 2D:
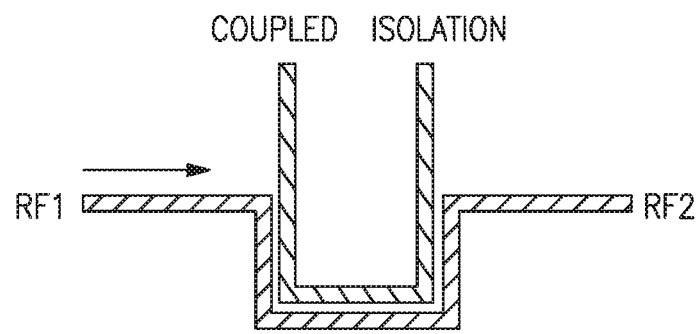
FIG. 2D is a simplified plan view of another arrangement of main and coupled lines in an RF coupler.

It should also be appreciated that in any of the of the embodiments of the coupler structures disclosed herein, the main line 110 and coupled line 115 need not be straight lines as illustrated in FIGS. 4B, 5B, 5D, 5F, 5H, and 5J, but may be formed as coils or with jogged portions, as illustrated in FIGS. 2B and 2C, respectively.

In some embodiments the coupler 105 is a bi-directional coupler. In various embodiments, the active layer 125 may be provided underneath the entire coupler 105, under only the main line 110 of the coupler 105, under only the coupled line 115 of the coupler, or partially under the main line 110, the coupled line 115, or both. In some embodiments, the active layer 125 may be square or rectangular shaped or patterned as a grid or comb-like structure. Doping levels in the active layer 125 may be selected to control an optimum voltage V1 to be applied to produce a desired suppression of substrate effects in different portions of the coupler 105. The contact 130 may be located in different locations or at different distances from the coupler 105 than illustrated in FIGS. 3-5J and may have different shapes in different embodiments. For example, the contact 130 may be in the form of a point contact, a disc, a line, a square or rectangle, or another polygon. In some embodiments, the design of the coupler 105 may dictate desired locations or configurations of the contact 130.

Figure 6:
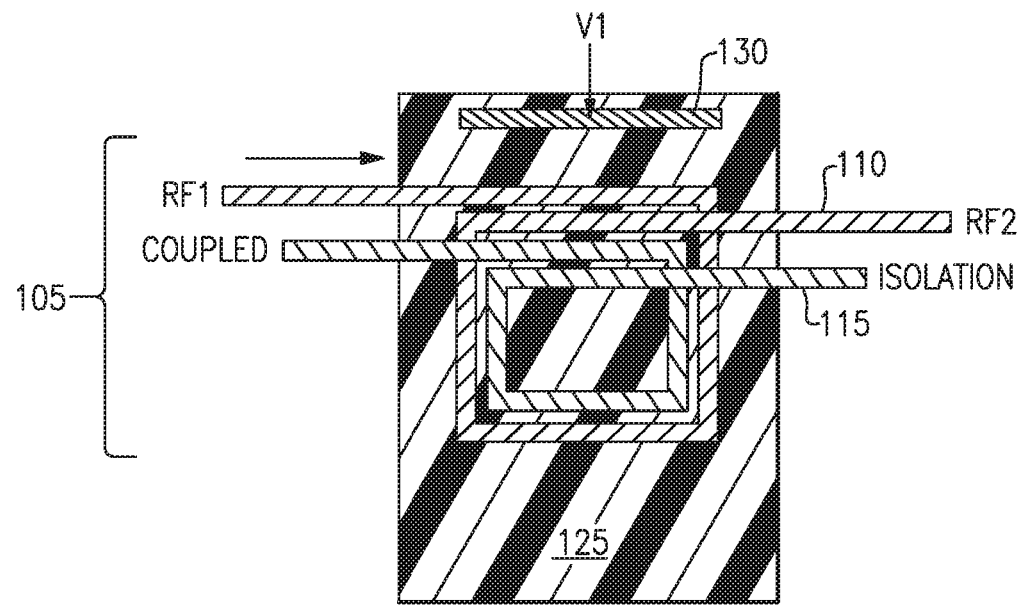
FIG. 6 is a simplified plan view of an embodiment of an RF coupler structure.
Figure 7:
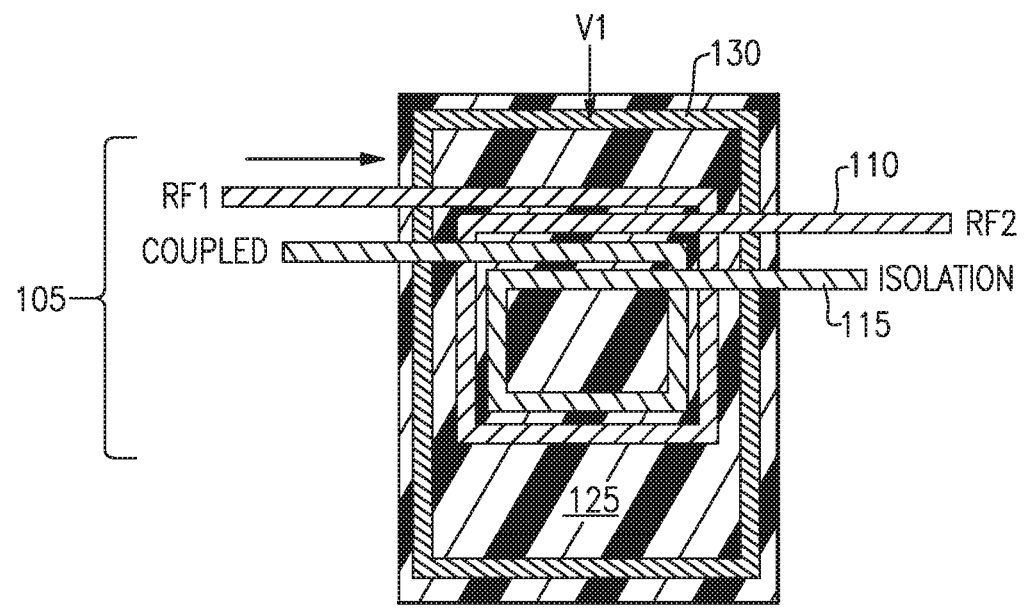
FIG. 7 is a simplified plan view of another embodiment of an RF coupler structure.

FIG. 6 illustrates an embodiment in which the contact 130 is in the form of a line on one side of the coupler 105. FIG. 7 illustrates an embodiment where the contact 130 surrounds a region beneath the coupler 105 on the active layer 125. FIGS. 8A and 8B illustrate an embodiment in which the active layer 125 is formed beneath the main line 110, but not the coupled line 115 and the contact 130 is in the form of a line. FIG. 8B is a cross-sectional view of FIG. 8A taken along line 8B. FIGS. 9A and 9B illustrate an embodiment in which the active layer 125 is formed beneath the coupled line 115, but not the main line 110 and the contact 130 is in the form of a line, with FIG. 9B being a cross-sectional view of FIG. 9A taken along line 9B.

Figure 10:
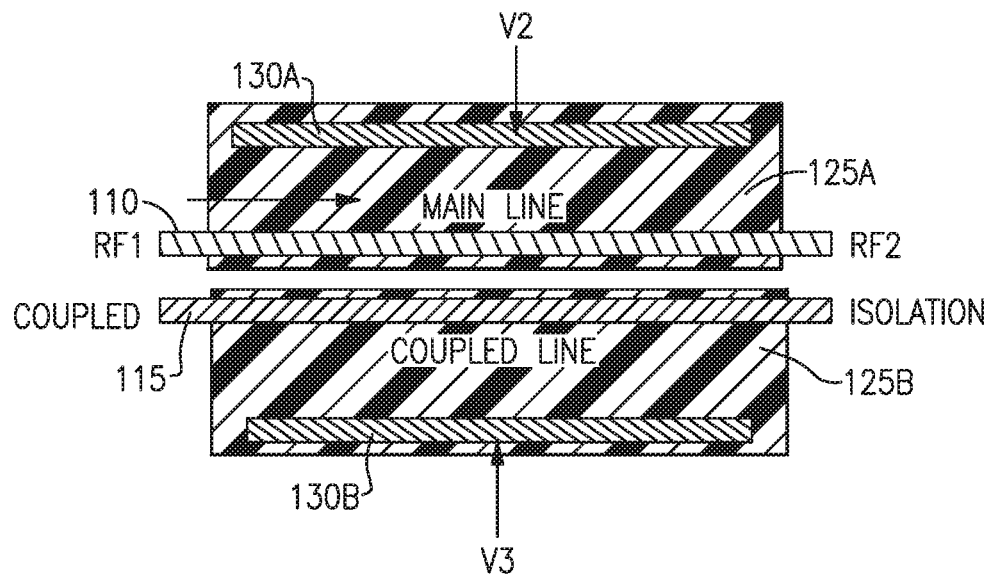
FIG. 10 is a simplified plan view of another embodiment of an RF coupler structure.

FIG. 10 illustrates an embodiment in which the active region is patterned into two separate active regions 125A, 125B disposed beneath the main line 110 and coupled line 115, respectively. Each active region 125A, 125 has an associated contact 130A, 130B, illustrated in the form of lines in FIG. 10. Voltages V2, V3 may be applied to the respective contacts 130A, 130B. Voltages V2, V3 may be the same or different.

Figure 11A:
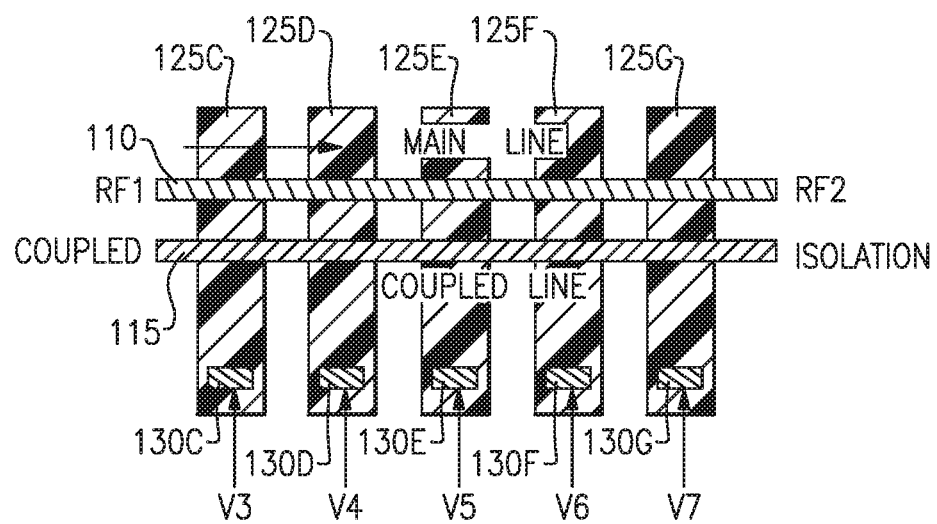
FIG. 11A is a simplified plan view of another embodiment of an RF coupler structure.
Figure 11B:
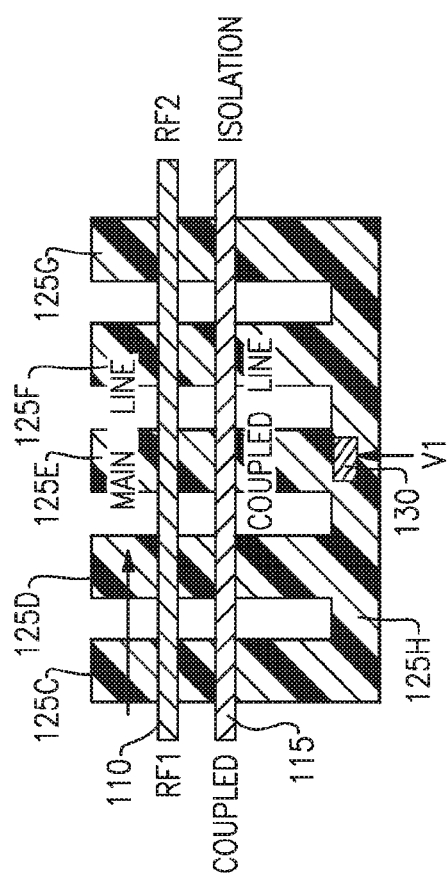
FIG. 11B is a simplified plan view of another embodiment of an RF coupler structure.

FIG. 11A illustrates an embodiment in which the active region is patterned into a plurality of separate active regions 125C, 125D, 125E, 125F, 125G disposed beneath different portions of the main line 110 and coupled line 115. Each of the separate active regions 125C, 125D, 125E, 125F, 125G is disposed beneath a portion of both the main line 110 and the coupled line 115. The active regions 125C, 125D, 125E, 125F, 125G have associated contacts 130C, 130D, 130E, 130F, 130G. Voltages V3, V4, V5, V6, and V7 may be applied to the respective contacts 130C, 130D, 130E, 130F, 130G. Any one or more of voltages V3, V4, V5, V6, and V7 may be the same or different from any one or more other of voltages V3, V4, V5, V6, and V7. In a variation of the embodiment of FIG. 11A, illustrated in FIG. 11B, the active region may form a comb structure wherein the active regions 125C, 125D, 125E, 125F, 125G are connected by one or more bus bars 125H having a single contact 130.

Figure 12:
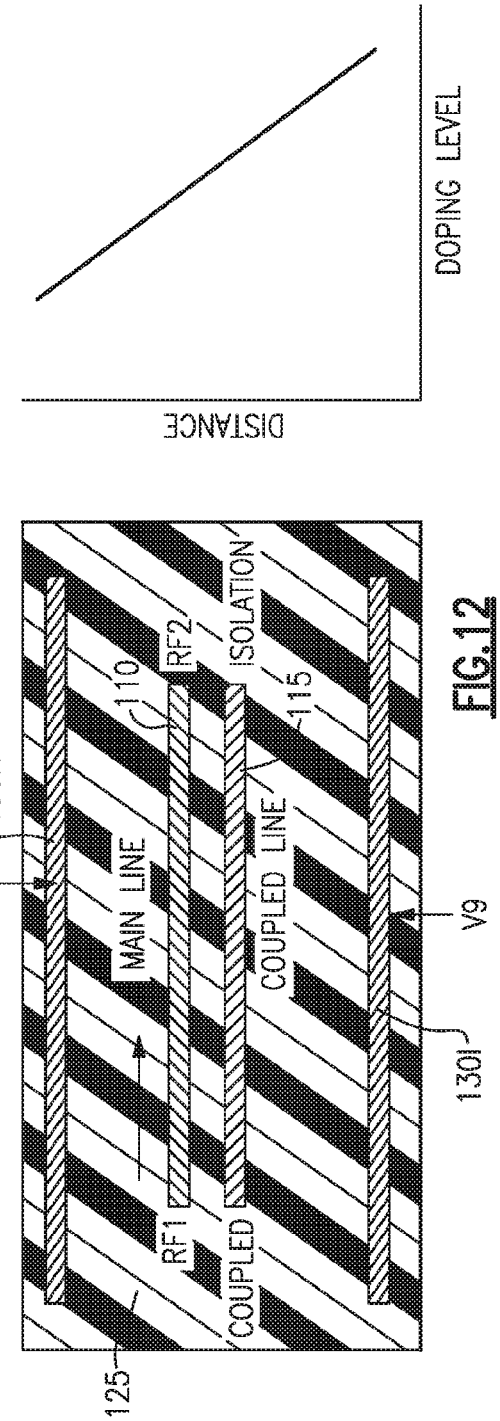
FIG. 12 is a simplified plan view of another embodiment of an RF coupler structure.

In further embodiments, a doping level or dopant concentration in the active layer 125 and/or a bias applied to the active layer 125 through one or more contacts may vary across the active layer 125 and create bias gradient effects across the active layer 125. As illustrated in FIG. 12, a doping level of the active layer 125 may vary in a direction normal to the direction of signal propagation through the main line 110 and/or coupled line 115. A different voltage V8 may be applied to a contact 130H on a first side of the main line 110 and/or coupled line 115 as compared to a voltage V9 applied a to a contact 130I on a second side of the main line 110 and/or coupled line 115 to produce a bias gradient in the active layer 125 in a direction normal to the direction of signal propagation through the main line 110 and/or coupled line 115.

Figure 13:
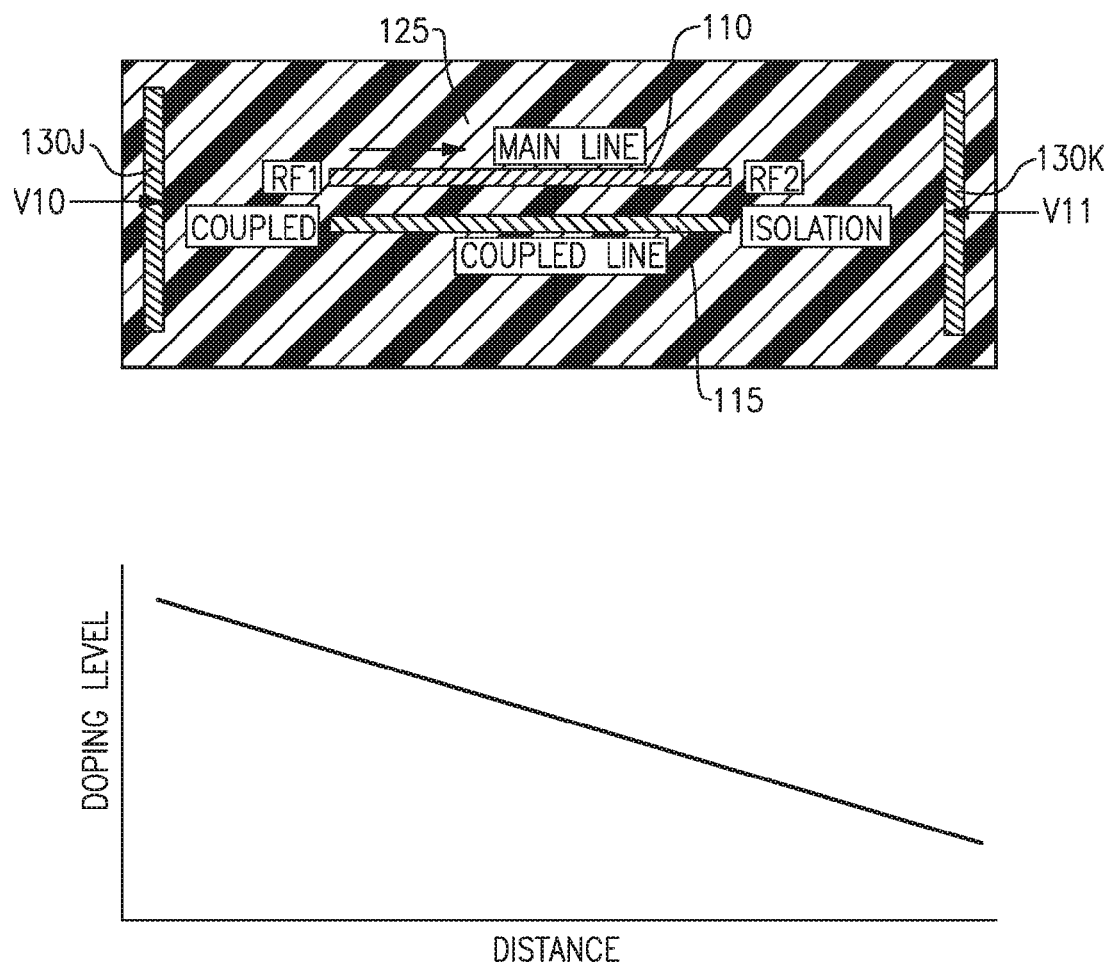
FIG. 13 is a simplified plan view of another embodiment of an RF coupler structure.

As illustrated in FIG. 13, in another example, a doping level of the active layer 125 may vary in a direction parallel to the direction of signal propagation through the main line 110 and/or coupled line 115. A different voltage V10 may be applied to a contact 130J on a first side of the main line 110 and/or coupled line 115 as compared to a voltage V11 applied a to a contact 130K on a second side of the main line 110 and/or coupled line 115 to produce a bias gradient in the active layer 125 in a direction parallel to the direction of signal propagation through the main line 110 and/or coupled line 115. The doping levels in FIGS. 12 and 13 are illustrated as changing monotonically with distance across the active layer 125, however, it should be appreciated that, in other embodiments, the doping levels may change in a logarithmic, step function, or other manner as desired with distance across the active layer 125.

Although not shown in FIG. 6-FIG. 13 it is to be understood that in these embodiments appropriate insulator or dielectric layers, for example first dielectric layer 120 illustrated in FIGS. 3-5J and/or dielectric layer 205 illustrated in FIGS. 5A-5J, electrically insulate the main line 110 and coupled line 115 from one another, overlapping portions of the main line 110 and coupled line 115 from one another, and the main line 110 and coupled line 115 from the contact(s) 130 and active layer(s) 125.

Figure 17:
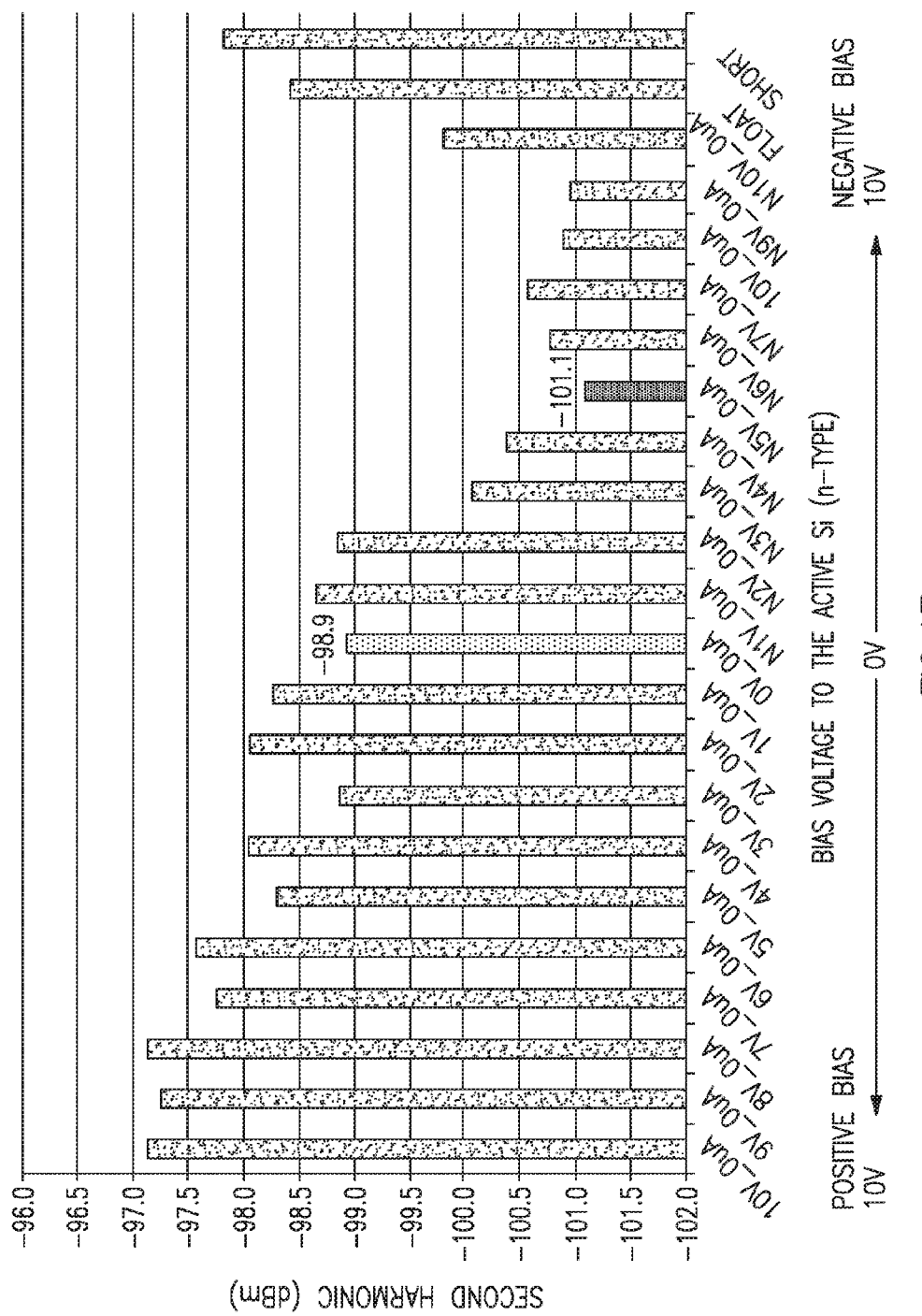
FIG. 17 illustrates results of testing performed on an embodiment of an RF coupler as disclosed herein.

Testing was performed on a coupler similar to that illustrated in FIGS. 3A and 3B to determine the effect of application of a negative voltage bias to the active layer 125 on second order (2fo) harmonics at 700 MHz. In the tested device, the main and coupled lines 110, 115 were formed of copper with a thickness of about 3 µm. The oxide layer below the main and coupled lines 110, 115 had a thickness of about 5 µm. The N-type active silicon layer had a thickness of about 0.14 µm. The buried oxide layer had a thickness of about 1 µm. The handle wafer had a thickness of about 200 µm. The results of this testing is illustrated in FIG. 17. As can be seen, the magnitude of the second order harmonic decreased with increasing negative bias from −98.9 dBm at a bias of zero volts to −101.1 dBm at a bias of negative five volts. As the negative bias increased to negative 10 volts the magnitude of the second order harmonic began to increase. The magnitude of the second order harmonic with the active layer 125 biased to negative five volts was lower than that observed when the active layer 125 was left floating or was shorted to ground. These results show that application of an appropriate voltage bias to the active layer in coupler structures as disclosed herein may effectively decrease substrate effects and increase the performance of the coupler.

Figure 14:
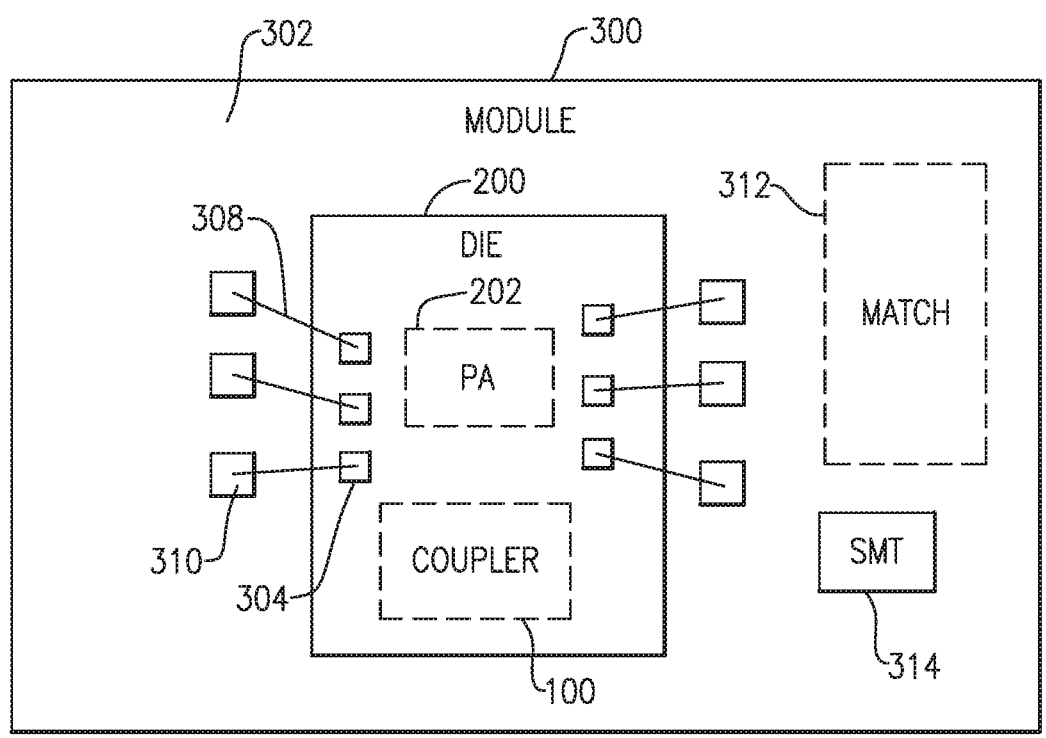
FIG. 14 is a block diagram of one example of a module including a coupler according to aspects of the present invention.

Embodiments of the coupler 100 described herein can be implemented in a variety of different modules including, for example, a stand-alone coupler module, a front-end module, a module combining the coupler with an antenna switching network, an impedance matching module, an antenna tuning module, or the like. FIG. 14 illustrates one example of a module 300 that can include any of the embodiments or examples of the coupler discussed herein. Module 300 has a packaging substrate 302 that is configured to receive a plurality of components. In some embodiments, such components can include a die 200 having one or more features as described herein. For example, the die 200 can include a power amplifier (PA) circuit 202 and a coupler 100. A plurality of connection pads 304 can facilitate electrical connections such as wirebonds 308 to connection pads 310 on the substrate 302 to facilitate passing of various power and signals to and from the die 200.

In some embodiments, other components can be mounted on or formed on the packaging substrate 302. For example, one or more surface mount devices (SMT) 314 and one or more matching networks 312 can be implemented. In some embodiments, the packaging substrate 302 can include a laminate substrate.

In some embodiments, the module 300 can also include one or more packaging structures to, for example, provide protection and facilitate easier handling of the module 300. Such a packaging structure can include an overmold formed over the packaging substrate 302 and dimensioned to substantially encapsulate the various circuits and components thereon.

It will be understood that although the module 300 is described in the context of wirebond-based electrical connections, one or more features of the present disclosure can also be implemented in other packaging configurations, including flip-chip configurations.

Embodiments of the coupler disclosed herein, optionally packaged into the modules 300, may be advantageously used in a variety of electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a telephone, a television, a computer monitor, a computer, a modem, a hand held computer, a laptop computer, a tablet computer, an electronic book reader, a wearable computer such as a smart watch, a personal digital assistant (PDA), a microwave, a refrigerator, an automobile, a stereo system, a DVD player, a CD player, a digital music player such as an MP3 player, a radio, a camcorder, a camera, a digital camera, a portable memory chip, a health care monitoring device, a vehicular electronics system such as an automotive electronics system or an avionics electronic system, a washer, a dryer, a washer/dryer, a peripheral device, a wrist watch, a clock, etc. Further, the electronic devices can include unfinished products.

Figure 15:
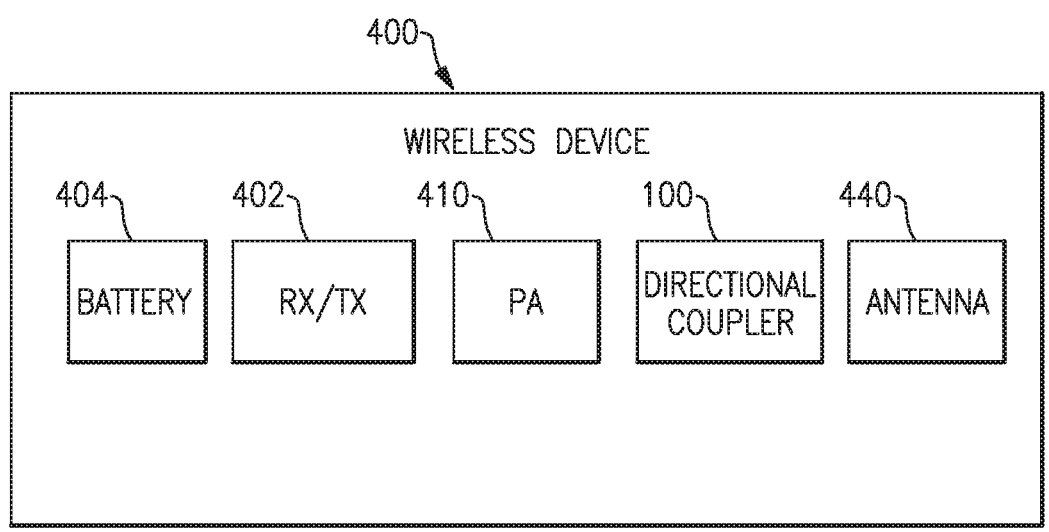
FIG. 15 is a block diagram of one example of a wireless device including a coupler according to aspects of the present invention.

FIG. 15 is a block diagram of a wireless device 400 including a coupler according to certain embodiments. The wireless device 400 can be a cellular phone, smart phone, tablet, modem, communication network or any other portable or non-portable device configured for voice and/or data communication. The wireless device 400 includes an antenna 440 that receives and transmits power signals and a coupler 100 that can measure the strength of a transmitted signal and provide an indication of the measured strength to other circuit elements for analysis purposes or to adjust subsequent transmissions. For example, the coupler 100 can measure a transmitted RF power signal from the power amplifier (PA) 410, which amplifies signals from a transceiver 402. The transceiver 402 can be configured to receive and transmit signals in a known fashion. As will be appreciate by those skilled in the art, the power amplifier 410 can be a power amplifier module including one or more power amplifiers. The wireless device 400 can further include a battery 404 to provide operating power to the various electronic components in the wireless device.

Figure 16:
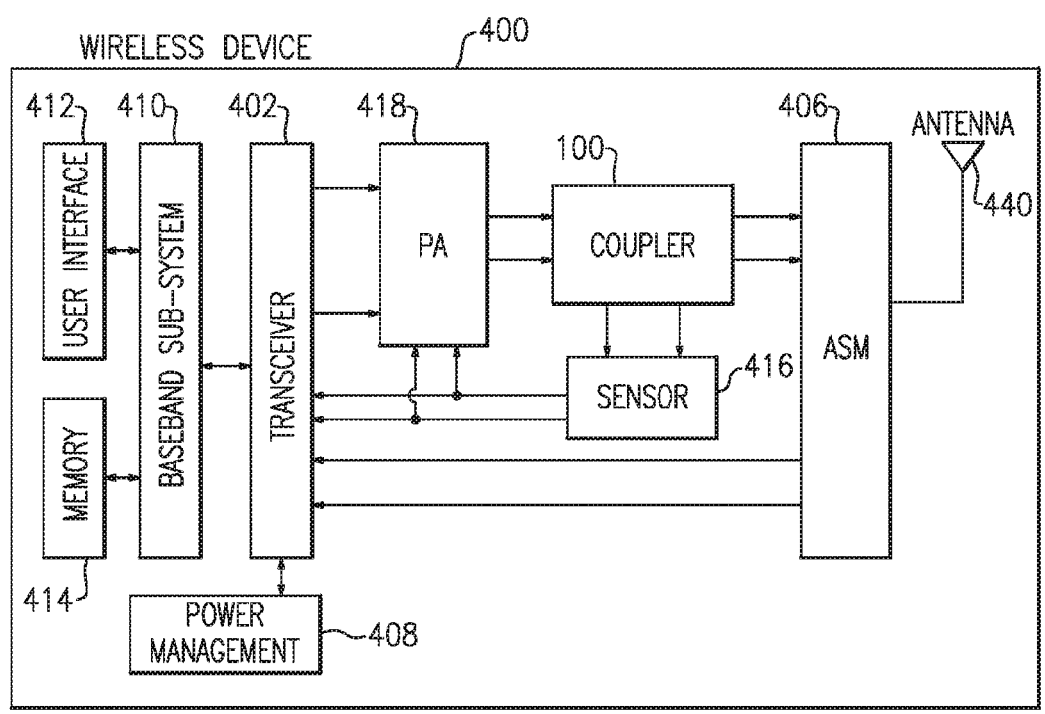
FIG. 16 is a block diagram showing a more detailed representation of one example of the wireless device of FIG. 15.

FIG. 16 is a more detailed block diagram of an example of the wireless device 400. As shown, the wireless device 400 can receive and transmit signals from the antenna 440. The transceiver 402 is configured to generate signals for transmission and/or to process received signals. Signals generated for transmission are received by the power amplifier (PA) 418, which amplifies the generated signals from the transceiver 402. In some embodiments, transmission and reception functionalities can be implemented in separate components (e.g. a transmit module and a receiving module), or be implemented in the same module. The antenna switch module 406 can be configured to switch between different bands and/or modes, transmit and receive modes, etc. As is also shown in FIG. 16, the antenna 440 both receives signals that are provided to the transceiver 402 via the antenna switch module 406 and also transmits signals from the wireless device 400 via the transceiver 402, the PA 418, the coupler 100, and the antenna switch module 406. However, in other examples multiple antennas can be used.

The wireless device 400 of FIG. 16 further includes a power management system 408 that is connected to the transceiver 402 that manages the power for the operation of the wireless device. The power management system 408 can also control the operation of a baseband sub-system 410 and other components of the wireless device 400. The power management system 408 provides power to the wireless device 400 via the battery 404 in a known manner, and includes one or more processors or controllers that can control the transmission of signals and can also configure the coupler 100 based upon the frequency of the signals being transmitted, for example.

In one embodiment, the baseband sub-system 410 is connected to a user interface 412 to facilitate various input and output of voice and/or data provided to and received from the user. The baseband sub-system 410 can also be connected to memory 414 that is configured to store data and/or instructions to facilitate the operation of the wireless device, and/or to provide storage of information for the user.

The power amplifier 418 can be used to amplify a wide variety of RF or other frequency-band transmission signals. For example, the power amplifier 418 can receive an enable signal that can be used to pulse the output of the power amplifier to aid in transmitting a wireless local area network (WLAN) signal or any other suitable pulsed signal. The power amplifier 418 can be configured to amplify any of a variety of types of signal, including, for example, a Global System for Mobile (GSM) signal, a code division multiple access (CDMA) signal, a W-CDMA signal, a Long Term Evolution (LTE) signal, or an EDGE signal. In certain embodiments, the power amplifier 110 and associated components including switches and the like can be fabricated on GaAs substrates using, for example, pHEMT or BiFET transistors, or on a silicon substrate using CMOS transistors.

Still referring to FIG. 16, the wireless device 400 can also include a coupler 100 having one or more directional EM couplers for measuring transmitted power signals from the power amplifier 418 and for providing one or more coupled signals to a sensor module 416. Coupler 100 illustrated in FIG. 16 may be any of the couplers 100, 100', 200, etc., described with reference to FIGS. 1-13 above. The sensor module 416 can in turn send information to the transceiver 402 and/or directly to the power amplifier 418 as feedback for making adjustments to regulate the power level of the power amplifier 418. In this way the coupler 100 can be used to boost/decrease the power of a transmission signal having a relatively low/high power. It will be appreciated, however, that the coupler 100 can be used in a variety of other implementations.

In certain embodiments in which the wireless device 400 is a mobile phone having a time division multiple access (TDMA) architecture, the coupler 100 can advantageously manage the amplification of an RF transmitted power signal from the power amplifier 418. In a mobile phone having a time division multiple access (TDMA) architecture, such as those found in Global System for Mobile Communications (GSM), code division multiple access (CDMA), and wideband code division multiple access (W-CDMA) systems, the power amplifier 418 can be used to shift power envelopes up and down within prescribed limits of power versus time. For instance, a particular mobile phone can be assigned a transmission time slot for a particular frequency channel. In this case the power amplifier 418 can be employed to aid in regulating the power level of one or more RF power signals over time, so as to prevent signal interference from transmission during an assigned receive time slot and to reduce power consumption. In such systems, the coupler 100 can be used to measure the power of a power amplifier output signal to aid in controlling the power amplifier 418, as discussed above. The implementation shown in FIG. 16 is exemplary and non-limiting. For example, the implementation of FIG. 16 illustrates the coupler 100 being used in conjunction with a transmission of an RF signal, however, it will be appreciated that various examples of the integrated filter-coupler discussed herein can also be used with received RF or other signals as well.

The phraseology and terminology used herein is for the purpose of description and should not be regarded as limiting. As used herein, the term "plurality" refers to two or more items or components. The terms "comprising," "including," "carrying," "having," "containing," and "involving," whether in the written description or the claims and the like, are open-ended terms, i.e., to mean "including but not limited to." Thus, the use of such terms is meant to encompass the items listed thereafter, and equivalents thereof, as well as additional items. Only the transitional phrases "consisting of" and "consisting essentially of," are closed or semi-closed transitional phrases, respectively, with respect to the claims. Use of ordinal terms such as "first," "second," "third," and the like in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Having thus described several aspects of at least one embodiment, it is to be appreciated various alterations, modifications, and improvements will readily occur to those skilled in the art. Any feature described in any embodiment may be included in or substituted for any feature of any other embodiment. Such alterations, modifications, and improvements are intended to be part of this disclosure, and are intended to be within the scope of the invention. Accordingly, the foregoing description and drawings are by way of example only.

What is claimed is:

1. An electromagnetic coupler assembly comprising:
    a silicon on insulator (SOI) wafer including a handle wafer having an oxide layer disposed on a first surface thereof, a layer of active semiconductor disposed on the oxide layer;
    a voltage terminal disposed on the layer of active semiconductor to receive a supply voltage;
    a layer of dielectric material disposed on the layer of active semiconductor;
    a main transmission line disposed on the layer of dielectric material; and
    a coupled transmission line disposed on the layer of dielectric material and configured to provide a coupled signal on the coupled transmission line responsive to receipt of an input signal received on the main transmission line, at least a portion of one of the main transmission line and the coupled transmission line being disposed above at least a portion of the layer of active semiconductor.

2. The electromagnetic coupler assembly of claim 1 further comprising a second layer of dielectric material disposed above one of the main transmission line and the coupled transmission line and below the other of the main transmission line and the coupled transmission line.

3. The electromagnetic coupler assembly of claim 1 wherein the layer of active semiconductor comprises one of N-type silicon and P-type silicon.

4. The electromagnetic coupler assembly of claim 1 wherein the voltage terminal is positioned to a single side of the main transmission line and of the coupled transmission line.

5. The electromagnetic coupler assembly of claim 1 wherein the voltage terminal surrounds an area beneath portions of the main transmission line and of the coupled transmission line.

6. The electromagnetic coupler assembly of claim 1 wherein the layer of active semiconductor is disposed beneath a portion of the main transmission line but not beneath the coupled transmission line.

7. The electromagnetic coupler assembly of claim 1 wherein the layer of active semiconductor is disposed beneath a portion of the coupled transmission line but not beneath the main transmission line.

8. The electromagnetic coupler assembly of claim 1 wherein the layer of active semiconductor includes a first portion disposed beneath a portion of the coupled transmission line and a second portion electrically isolated from the first portion and disposed beneath a portion of the main transmission line.

9. The electromagnetic coupler assembly of claim 8 including a first voltage terminal in electrical communication with the first portion of the layer of active semiconductor and a second voltage terminal in electrical communication with the second portion of the layer of active semiconductor.

10. The electromagnetic coupler assembly of claim 1 wherein the layer of active semiconductor includes a plurality of portions electrically isolated from one another, each of the plurality of portions disposed beneath different respective portions of the main transmission line and the coupled transmission line.

11. The electromagnetic coupler assembly of claim 10 wherein each of the plurality of portions of the layer of active semiconductor includes a respective voltage terminal.

12. The electromagnetic coupler assembly of claim 1 wherein the voltage terminal includes a first portion disposed beneath the main transmission line and the coupled transmission line at a position laterally positioned from a first side of the main transmission line and of the coupled transmission line in a direction normal to a direction of intended signal flow through one of the main transmission line and the coupled transmission line and a second portion disposed beneath the main transmission line and the coupled transmission line at a position laterally positioned from a second side of the main transmission line and of the coupled transmission line in a second direction normal to the direction of intended signal flow through the one of the main transmission line and the coupled transmission line.

13. The electromagnetic coupler assembly of claim 1 wherein the voltage terminal includes a first portion disposed beneath the main transmission line and the coupled transmission line at a position laterally disposed from a first side of the main transmission line and of the coupled transmission line in a direction parallel to a direction of intended signal flow through one of the main transmission line and the coupled transmission line and a second portion disposed beneath the main transmission line and the coupled transmission line at a position laterally disposed from a second side of the main transmission line and of the coupled transmission line in a second direction parallel to the direction of intended signal flow through the one of the main transmission line and the coupled transmission line.

14. The electromagnetic coupler assembly of claim 1 wherein the layer of active semiconductor includes a doping concentration that varies along a direction normal to a direction of intended signal flow through one of the main transmission line and the coupled transmission line.

15. The electromagnetic coupler assembly of claim 1 wherein the layer of active semiconductor includes a doping concentration that varies along a direction parallel to a direction of intended signal flow through one of the main transmission line and the coupled transmission line.

16. The electromagnetic coupler assembly of claim 1 wherein application of the supply voltage to the layer of active semiconductor reduces a magnitude of substrate effects in the electromagnetic coupler assembly as compared to a magnitude of substrate effects in the electromagnetic coupler assembly in an absence of the application of the supply voltage to the layer of active semiconductor.

17. A packaged module comprising:
an electromagnetic coupler assembly, the electromagnetic coupler assembly including
a silicon on insulator (SOI) wafer including a handle wafer having an oxide layer disposed on a first surface thereof,
a layer of active semiconductor disposed on the oxide layer,
a voltage terminal disposed on the layer of active semiconductor to receive a supply voltage,
a layer of dielectric material disposed on the layer of active semiconductor,
a main transmission line disposed on the layer of dielectric material, and
a coupled transmission line disposed on the layer of dielectric material and configured to provide a coupled signal on the coupled line responsive to receipt of an input signal received on the main transmission line, at least a portion of one of the main transmission line and the coupled transmission line being disposed above at least a portion of the layer of active semiconductor.

18. An electronic device including the packaged module of claim 17.

19. A wireless communications device including the packaged module of claim 17.

20. An electromagnetic coupler assembly comprising:
a handle wafer including an oxide layer disposed on a first surface thereof;
an active semiconductor layer disposed on at least a portion of the oxide layer, the active semiconductor layer including a voltage terminal to receive a supply voltage;
a dielectric layer disposed on the active semiconductor layer; and
a coupler disposed on the dielectric layer, the active semiconductor layer extending at least partially below the coupler to electrically isolate the handle wafer from the coupler based on application of the supply voltage.

21. A method of fabricating an electromagnetic coupler assembly comprising:
depositing a layer of dielectric material on an upper surface of active semiconductor of a silicon on insulator (SOI) wafer including a layer of the active semiconductor, a buried oxide layer disposed beneath the layer of the active semiconductor, and a handle wafer disposed beneath the buried oxide layer;
forming an electrical contact with the layer of the active semiconductor;
forming a main transmission line above the layer of dielectric material; and
forming a coupled transmission line above the layer of dielectric material, the coupled transmission line configured to provide a coupled signal on the coupled transmission line responsive to receipt of an input signal received on the main transmission line, at least a portion of one of the main transmission line and the coupled transmission line being formed above at least a portion of the layer of active semiconductor.

22. The method of claim 21 wherein both the main transmission line and the coupled transmission line are formed in contact with an upper surface of the layer of dielectric material.

23. The method of claim 21 further comprising:
forming one of the main transmission line and the coupled transmission line in contact with an upper surface of the layer of dielectric material;
forming a second layer of dielectric material over the layer of dielectric material; and
forming the other of the main transmission line and the coupled transmission line on an upper surface of the second layer of dielectric material.

24. The method of claim 21 wherein one of the main transmission line and the coupled transmission line is formed above at least a portion of the layer of active semiconductor and the other of the main transmission line and the coupled transmission line is not formed above at least a portion of the layer of active semiconductor.

25. The method of claim 21 wherein both the main transmission line and the coupled transmission line are formed above at least a portion of the layer of active semiconductor.

26. The method of claim 21 further comprising removing at least a lower portion of the handle wafer.

* * * * *